United States Patent
Kwon et al.

(10) Patent No.: US 11,251,790 B2
(45) Date of Patent: Feb. 15, 2022

(54) POWER RELAY ASSEMBLY FOR AN ELECTRIC VEHICLE AND DRIVING METHOD THEREOF

(71) Applicant: YURA CORPORATION CO., LTD., Seongnam-si (KR)

(72) Inventors: Dae Hwan Kwon, Seongnam-si (KR); Ho Kyung Kim, Yongin-si (KR)

(73) Assignee: YURA CORPORATION CO., LTD., Seongnam-si (KR)

(*) Notice: Subject to any disclaimer, the term of this patent is extended or adjusted under 35 U.S.C. 154(b) by 0 days.

(21) Appl. No.: 16/958,502

(22) PCT Filed: Dec. 18, 2018

(86) PCT No.: PCT/KR2018/016131
§ 371 (c)(1),
(2) Date: Jun. 26, 2020

(87) PCT Pub. No.: WO2019/132373
PCT Pub. Date: Jul. 4, 2019

(65) Prior Publication Data
US 2021/0067155 A1    Mar. 4, 2021

(30) Foreign Application Priority Data

Dec. 28, 2017  (KR) .................. 10-2017-0183019
Dec. 28, 2017  (KR) .................. 10-2017-0183020

(51) Int. Cl.
*B60L 58/10*        (2019.01)
*H03K 17/687*    (2006.01)
(Continued)

(52) U.S. Cl.
CPC ............ *H03K 17/687* (2013.01); *B60L 53/60* (2019.02); *B60L 58/10* (2019.02); *B60R 16/02* (2013.01); *H03K 17/567* (2013.01)

(58) Field of Classification Search
CPC .... H03K 17/687; H03K 17/567; B60L 53/60; B60R 16/03
See application file for complete search history.

(56) References Cited

U.S. PATENT DOCUMENTS 8,228,037 B2 * 7/2012 Furukawa ............. H02J 7/0026
                                                                  320/134
9,806,517 B2 * 10/2017 Mo ........................ H02H 7/222
(Continued)

FOREIGN PATENT DOCUMENTS

EP       2 774 798        9/2014
JP       2011-254650      12/2011
(Continued)

OTHER PUBLICATIONS

Extended European Search Report, corresponding to European Application No./Patent No. 20187227.2, dated Oct. 15, 2020.
(Continued)

*Primary Examiner* — Dinh T Le
(74) *Attorney, Agent, or Firm* — Kile Park Reed & Houtteman PLLC

(57) ABSTRACT

A power relay assembly for an electric vehicle and a driving method thereof according to an embodiment of the present invention connect the first switching unit and the second switching unit connected in series with each other in parallel with the relay switch, and by allowing the first switching unit and the second switching unit to include semiconductor switching elements and diodes therein, not only when power is supplied from the battery to the load side, but also when charging is performed by supplying a charging current to the battery, it is possible to supply or cut off power while preventing sparks and arcs at the relay contact point.

27 Claims, 23 Drawing Sheets

(51) Int. Cl.
*B60L 53/60* (2019.01)
*B60R 16/02* (2006.01)
*H03K 17/567* (2006.01)

(56) References Cited

U.S. PATENT DOCUMENTS

| | | | |
|---|---|---|---|
| 10,411,501 B2* | 9/2019 | Akita | H02J 9/06 |
| 10,530,166 B2* | 1/2020 | Song | H02J 7/0021 |
| 2010/0127663 A1 | 5/2010 | Furukawa et al. | |
| 2011/0111268 A1 | 5/2011 | Weng et al. | |
| 2014/0188315 A1* | 7/2014 | Kang | B60L 3/0023 701/22 |
| 2014/0252847 A1 | 9/2014 | Yang et al. | |

FOREIGN PATENT DOCUMENTS

| | | |
|---|---|---|
| JP | 2014-30108 | 2/2014 |
| JP | 2014-172602 | 9/2014 |
| JP | 2014-241187 | 12/2014 |
| JP | 2015-173110 | 10/2015 |
| KR | 10-0559398 | 3/2006 |
| KR | 10-2010-0104728 | 9/2010 |
| KR | 10-1314114 | 10/2013 |
| KR | 10-2014-0025674 | 3/2014 |
| KR | 10-1521984 | 5/2015 |
| KR | 10-1780396 | 9/2017 |
| KR | 10-2087701 | 3/2020 |
| KR | 10-2087702 | 3/2020 |
| WO | 2013-089517 | 6/2013 |
| WO | 2016/035278 | 3/2016 |

OTHER PUBLICATIONS

International Search report, with English translation, corresponding to International Application No. PCT/KR2018/016131, dated Mar. 22, 2019.

Extended European Search Report for Application No./Patent No. 18897183.2, dated Jul. 1, 2021.

* cited by examiner

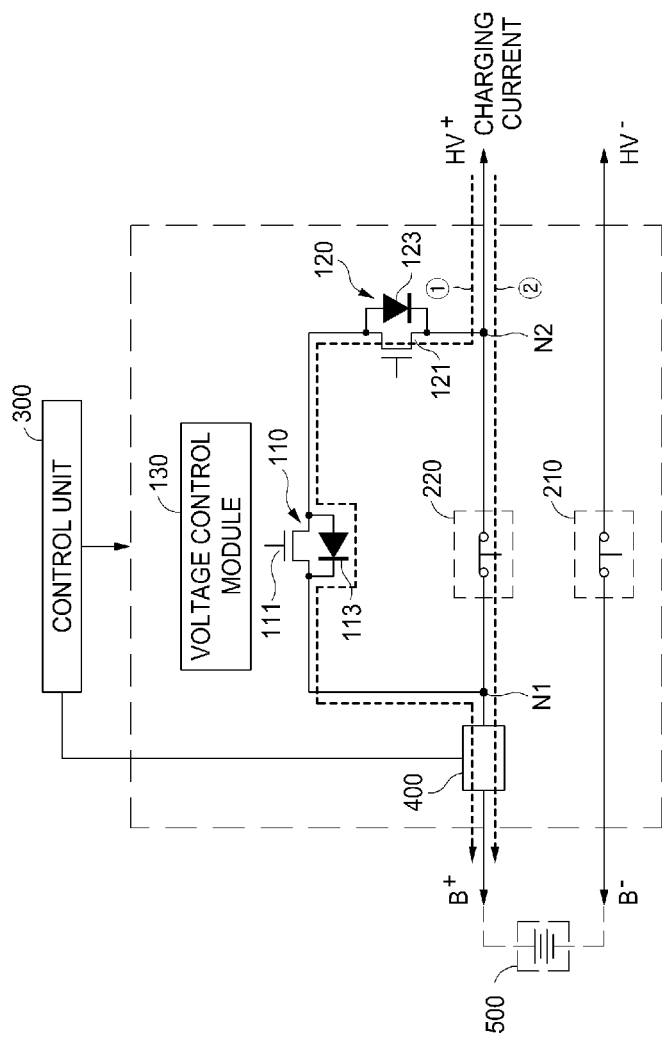

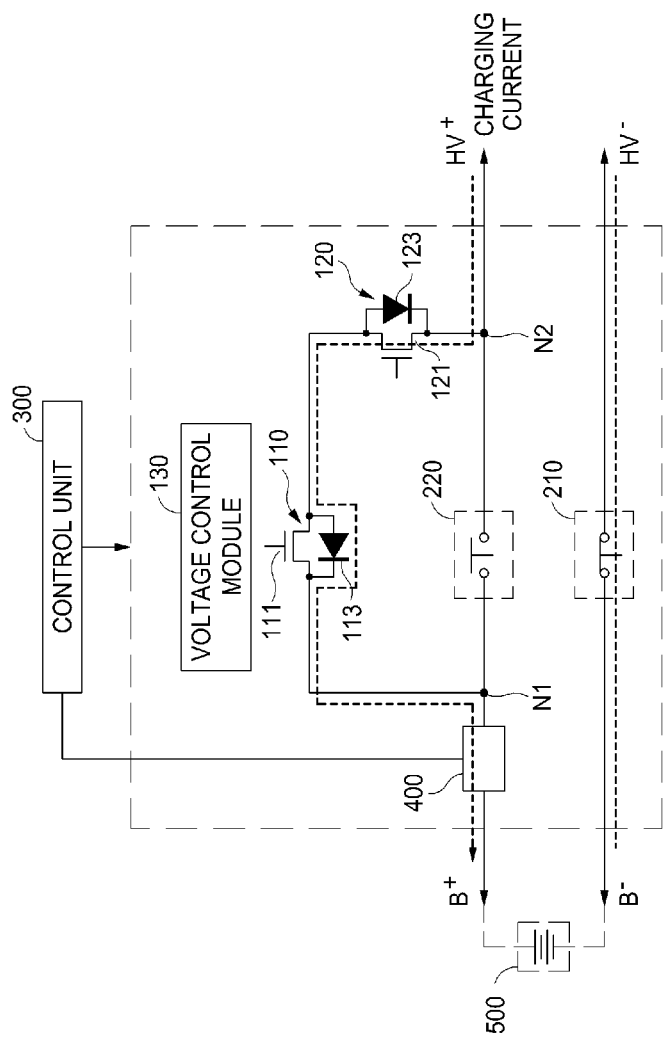

POWER RELAY ASSEMBLY FOR AN ELECTRIC VEHICLE AND DRIVING METHOD THEREOF

TECHNICAL FIELD

The present invention relates to a power relay assembly (PRA) and a driving method thereof, and more particularly, to a PRA for an electric vehicle and a driving method thereof.

BACKGROUND ART

In general, a power relay assembly (PRA) is a power blocking device that connects and disconnects power from a battery through a Power Control Unit (PCU) to a motor in electric vehicles and hybrid vehicles, and is a core component that serves as a main gate for supplying power.

In addition, the power relay assembly (PRA) acts as a safety device to completely cut off power in the event of a system failure or maintenance so that it plays a very important safety role in electric vehicles/hybrid vehicles.

These PRAs consist of high-voltage relays such as pre-charging relays (450V, 10 A or more) and main relays (450V, 100 to 150 A or more) and components such as high voltage/high current bus bars and terminals for wiring connections to the battery/inverter.

Among them, the key component is a high voltage relay that serves to connect and disconnect high voltage/high current. Conventionally, as such a high voltage relay, a mechanical relay structure in which a special gas (for example, H2 gas) is injected and sealed to prevent sparks that may occur at the contact point of the relay is adopted.

However, since the high voltage relay is heavy due to special gas, it increases the overall weight of the PRA. As a result, there is a problem that the fuel efficiency of the vehicle is lowered.

In addition, since the high voltage relay not only has a complicated mechanical structure, but also has a high material cost of its parts, the price of that part is high. As a result, there is a problem that the cost of the PRA is increased.

In addition, the PRA including the high voltage relay requires an increase in wiring due to the addition of peripheral devices. As a result, there is a problem that the arrangement of the wiring becomes complicated.

As an example of the prior art for solving these problems, as shown in FIG. 1, a smart PRA using a semiconductor switching element has been proposed. Korea Patent No. 10-0559398 shown in FIG. 1 (Title of invention: vehicle power connection control device for hybrid and fuel cell) turns on the second main relay 7 that connects the −terminal of the battery and the inverter to each other at the initial start-up, and before the first main relay 5 is connected, performs pulse width modulation (PWM) control of the power semiconductor 6 to intermittently flow current and charge the capacitor 8b in advance, and forms an equipotential for the same voltage across the first main relay 5, and then connects the first main relay 5, so that when the first main relay 5 is connected, sparks are prevented from occurring at both ends of the first main relay 5.

In addition, when the power supply is cut off, in the state where the first main relay 5, the power semiconductor 6, and the second main relay 7 are simultaneously turned on, only the first main relay 5 is first turned off. At this time, since the current flowing through the first main relay 5 continues to flow through the power semiconductor 6, the first main relay 5 can safely cut off power because sparks do not occur at the contact point.

However, in the case of such prior art, since it is possible to cut off the normal power while supplying power from the high voltage battery of the electric vehicle to the load (inverter) but the operation to cut off the power when charging the high voltage battery cannot be performed, a new structure of a PRA driving apparatus for an electric vehicle is required.

DISCLOSURE OF THE INVENTION

Technical Problem

The present invention is to provide a power relay assembly for an electric vehicle and a driving method thereof that can perform power supply and shutdown while preventing sparking of the relay not only when a high voltage battery of an electric vehicle is discharged to supply power to a load, but also when a charging current is supplied to a high voltage battery.

Technical Solution

According to a first preferred embodiment of the present invention for solving the above-described problems, a power relay assembly for an electric vehicle includes: a first relay connected between a negative terminal of a battery and a negative terminal of a load side; a second relay connected between a positive terminal of the battery and a positive terminal of the load side; a first switching unit having one end connected to one end of the second relay on the positive terminal side of the battery and the other end connected to a second switching unit; the second switching unit is connected to the first switching unit, one end is connected to the load side one end of the second relay; a voltage control module configured to output a voltage control signal to the first switching unit according to a control signal inputted from a control unit to limit an amount of current flowing through the first switching unit; and the control unit configured to control the first relay, the second relay, the first switching unit, and the second switching unit by outputting a control signal.

In addition, each of the first switching unit and the second switching unit may include: a switching element configured to be turned on/off according to a control signal inputted from the control unit; and a diode connected in parallel with the switching element.

Moreover, diodes included in each of the first switching unit and the second switching unit may have opposite directions in a forward direction.

In addition, the diode of the first switching unit may be set so that the direction towards the positive terminal of the battery is forward, and the diode of the second switching unit may be set so that the direction towards the positive terminal of the load side is forward.

Furthermore, the switching element included in the first switching unit and the second switching unit may be implemented as an Insulated Gate Bipolar Transistor (IGBT) or Field Effect Transistor (FET), wherein the diode included in the first switching unit and the second switching unit may be implemented as an internal diode included in an IGBT or FET.

Moreover, when supplying power from the battery to the load side, the control unit may turn on the first relay, turn on the switching element of the first switching unit through the voltage control module to perform pre-charge by allowing a current outputted from the battery to flow to the load side through the switching element of the first switching unit and the diode of the second switching unit, and when equipotential between both ends of the second relay is formed, turn on the second relay and turns off the first switching unit through the voltage control module.

In addition, when the power supply from the battery to the load side is cut off, the control unit may turn on the switching element of the first switching unit through the voltage control module to allow the current outputted from the battery to flow to the load side through the second relay, the switching element of the first switching unit, and the diode of the second switching unit, and then turn off the second relay, and then turn off the switching element of the first switching unit through the voltage control module to cut off power supply.

Moreover, when charging current is supplied to the battery, the control unit may turn on the switching element of the second switching unit to allow the charging current to flow to the battery through the switching element of the second switching unit and the diode of the first switching unit, and then form equipotential between both ends of the second relay, and then turn on the second relay to allow the charging current to flow through the second relay, and then perform regular charging by turning off the switching element of the second switching unit.

Furthermore, when cutting off charging current supply, the control unit may turn on a switching element of the second switching unit to allow a charging current to flow to the battery through a switching element of the second switching unit and a diode of the first switching unit, and then turn off the second relay to cut off the charging current flowing through the second relay, and then cut off the supply of charging current by turning off the switching element of the second switching unit.

In addition, the power relay assembly may further include a current sensor installed between a positive terminal of the battery and one end of the second relay, and configured to measure at least one of a current outputted from the battery and a current flowing into the battery and output a current value to the control unit, wherein the control unit may output the control signal according to a current value inputted from the current sensor.

In addition, the power relay assembly may further include a communication unit configured to perform communication according to a CAN communication method or a LIN communication method with a main controller of a vehicle or a Battery Management System (BMS), receive a control command instructing to start (ON) or stop (OFF) the power relay assembly from the main controller or the BMS to output the received control command to the control unit, and transmit status information of the power relay assembly inputted from the control unit to the main controller or the BMS.

On the other hand, according to a first preferred embodiment of the present invention for solving the above-described problems, a method of driving a power relay assembly for an electric vehicle including a first relay connected between a negative terminal of a battery and a negative terminal of a load side, a second relay connected between a first node to which a positive terminal of the battery is connected and a second node to which a positive terminal of the load side is connected, a first switching unit connected between the first node and a second switching unit, and a second switching unit connected between the first switching unit and the second node, wherein the first switching unit and the second switching unit include a switching element and a diode connected in parallel with the switching element, respectively, includes: when supplying power from the battery to the load side, turning on the first relay; turning on the switching element of the first switching unit through a voltage control module to allow the current outputted from the battery to flow to the load side through the switching element of the first switching unit and the diode of the second switching unit to perform pre-charge; and when equipotential between both ends of the second relay is formed, turning on the second relay and turning off the first switching unit through the voltage control module.

In addition, the method may further include: when power supply to the load side is cut off from the battery, turning on the switching element of the first switching unit through the voltage control module to allow the current outputted from the battery to flow to the load side through the second relay and a switching element of the first switching unit and a diode of the second switching unit; turning off the second relay; and turning off the switching element of the first switching unit through the voltage control module to cut off the power supply.

In addition, the method may further include: when charging current is supplied to the battery, turning on the switching element of the second switching unit to allow the charging current to flow to the battery through the switching element of the second switching unit and the diode of the first switching unit to form equipotential between both ends of the second relay; turning on the second relay to allow a charging current to flow through the second relay; and performing regular charging by turning off the switching element of the second switching unit.

Furthermore, the method may further include: when cutting off the charging current supply, turning on a switching element of the second switching unit to allow a charging current to flow to the battery through a switching element of the second switching unit and a diode of the first switching unit; turning off the second relay to cut off the charging current flowing through the second relay; and cutting off charging current supply by turning off the switching element of the second switching unit.

On the other hand, according to a second preferred embodiment of the present invention for solving the above-described problems, a power relay assembly for an electric vehicle includes: a first relay connected between a negative terminal of a battery and a negative terminal of a load side; a second relay connected between a positive terminal of the battery and a positive terminal of the load side; a first switching unit having one end connected to one end of the second relay on the positive terminal side of the battery and the other end connected to a second switching unit; the second switching unit is connected to the first switching unit, one end is connected to the load side one end of the second relay; a pre-charge switching unit having one end connected to one end of the second relay on the positive terminal side of the battery and the other end connected to a protective resistance; the protective resistance connected between the pre-charge switching unit and a connection node of the first switching unit and the second switching unit; and a control unit configured to output a control signal to control on/off of the first relay, the second relay, the first switching unit, the second switching unit, and the pre-charge switching unit.

In addition, each of the first switching unit and the second switching unit may include: a switching element configured to be turned on/off according to a control signal inputted from the control unit; and a diode connected in parallel with the switching element.

Moreover, diodes included in each of the first switching unit and the second switching unit may have opposite directions in a forward direction.

In addition, the diode of the first switching unit may be set so that the direction towards the positive terminal of the battery is forward, and the diode of the second switching unit may be set so that the direction towards the positive terminal of the load side is forward.

Moreover, the switching element included in the first switching unit and the second switching unit may be implemented as an Insulated Gate Bipolar Transistor (IGBT) or Field Effect Transistor (FET), wherein the diode included in the first switching unit and the second switching unit may be implemented as an internal diode included in an IGBT or FET.

In addition, when supplying power from the battery to the load side, the control unit may turn on the first relay, turn on the pre-charge switching unit to perform pre-charge by allowing a current outputted from the battery to flow to the load side through the pre-charge switching unit and the diode of the second switching unit, and when equipotential between both ends of the second relay is formed, turn on the second relay and turns off the pre-charge switching unit.

In addition, when the power supply from the battery to the load side is cut off, the control unit may turn on the switching element included in the first switching unit to allow the current outputted from the battery to flow to the load side through the second relay, the switching element of the first switching unit, and the diode of the second switching unit, and then turn off the second relay, and then turn off the switching element included in the first switching unit to cut off power supply.

Moreover, when charging current is supplied to the battery, the control unit may turn on the switching element of the second switching unit to allow the charging current to flow to the battery through the switching element of the second switching unit and the diode of the first switching unit, and then form equipotential between both ends of the second relay, and then turn on the second relay to allow the charging current to flow through the second relay, and then perform regular charging by turning off the switching element of the second switching unit.

In addition, when cutting off charging current supply, the control unit may turn on a switching element of the second switching unit to allow a charging current to flow to the battery through a switching element of the second switching unit and a diode of the first switching unit, and then turn off the second relay to cut off the charging current flowing through the second relay, and then cut off the supply of charging current by turning off the switching element of the second switching unit.

Furthermore, the power relay assembly may further include a current sensor installed between a positive terminal of the battery and one end of the second relay, and configured to measure at least one of a current outputted from the battery and a current flowing into the battery and output a current value to the control unit, wherein the control unit may output a control signal according to the current value inputted from the current sensor.

In addition, the power relay assembly may further include a communication unit configured to perform communication according to a CAN communication method or a LIN communication method with a main controller of a vehicle or a Battery Management System (BMS), receive a control command instructing to start (ON) or stop (OFF) the power relay assembly from the main controller or the BMS to output the received control command to the control unit, and transmit status information of the power relay assembly inputted from the control unit to the main controller or the BMS.

On the other hand, according to a second preferred embodiment of the present invention for solving the above-described problems, a method of driving a power relay assembly for an electric vehicle including a first relay connected between a negative terminal of a battery and a negative terminal of a load side, a second relay connected between a first node to which a positive terminal of the battery is connected and a third node to which a positive terminal of the load side is connected, a first switching unit connected between the first node and a second node, a second switching unit connected between the second node and the third node, and a pre-charge switching unit and a protective resistance connected in series between the first node and the second node, wherein each of the first switching unit and the second switching unit includes a switching element and a diode connected in parallel with the switching element, includes: when supplying power from the battery to the load side, turning on the first relay; turning on the pre-charge switching unit to allow the current outputted from the battery to flow to the load side through the pre-charge switching unit and the diode of the second switching unit to perform pre-charge; and when equipotential between both ends of the second relay is formed, turning on the second relay and turning off the pre-charge switching unit.

In addition, the method may further include: when power supply from the battery to the load side is cut off, turning on the switching element included in the first switching unit to allow the current outputted from the battery to flow to the load side through the second relay and a switching element of the first switching unit and a diode of the second switching unit; turning off the second relay; and turning off the switching element included in the first switching unit to cut off the power supply.

Moreover, the method may further include: when charging current is supplied to the battery, turning on the switching element of the second switching unit to allow the charging current to flow to the battery through the switching element of the second switching unit and the diode of the first switching unit to form equipotential between both ends of the second relay; turning on the second relay to allow a charging current to flow through the second relay; and performing regular charging by turning off the switching element of the second switching unit.

Furthermore, the method may further include: when cutting off the charging current supply, turning on a switching element of the second switching unit to allow a charging current to flow to the battery through a switching element of the second switching unit and a diode of the first switching unit; turning off the second relay to cut off the charging current flowing through the second relay; and cutting off charging current supply by turning off the switching element of the second switching unit.

Advantageous Effects

A power relay assembly for an electric vehicle and a driving method thereof according to the first embodiment of the present invention connect the first switching unit and the second switching unit connected in series to each other in parallel with the relay switch, and allow the first switching unit and the second switching unit to include semiconductor switching elements and diodes therein, so that not only when power is supplied from the battery to the load side, but also when charging is performed by supplying a charging current to the battery, it is possible to supply or cut off power while preventing sparks and arcs at the relay contact point. In addition, by using the current characteristics of the semiconductor switching element included in the first switching unit or the second switching unit, the current is limited by adjusting the voltage applied to the semiconductor switching element so that no more than a constant current flows during the pre-charge operation, and thus, it is possible to prevent the rapid current from flowing without installing a separate resistor.

A power relay assembly for an electric vehicle and a driving method thereof according to the second embodiment of the present invention connect a pre-charge switching unit and a first switching unit and a second switching unit connected in series with each other in parallel with a relay switch and allow the first switching unit and the second switching unit to include semiconductor switching elements and diodes therein, so that not only when power is supplied from the battery to the load side, but also when charging is performed by supplying a charging current to the battery, it is possible to supply or cut off power while preventing sparks and arcs at the relay contact point.

BRIEF DESCRIPTION OF THE DRAWINGS

FIGS. 5A to 5C are views illustrating an operation process in which charging current is supplied to a battery according to a first preferred embodiment of the present invention.

FIGS. 8A to 8E are views illustrating an operation process in which power is supplied from a battery to a load side according to a second preferred embodiment of the present invention.

MODE FOR CARRYING OUT THE INVENTION

Hereinafter, preferred embodiments of the present invention will be described with reference to the accompanying drawings.

Figure 1:
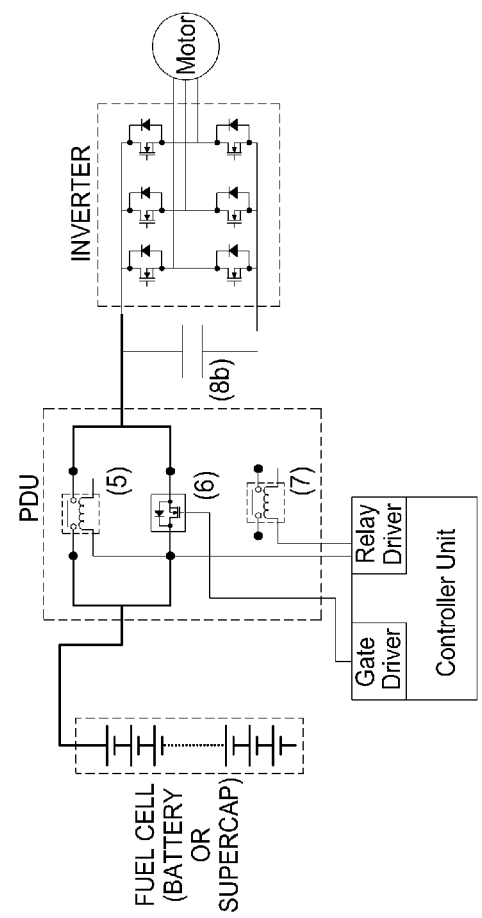
FIG. 1 is a view showing an example of a smart PRA according to the prior art.
Figure 2:
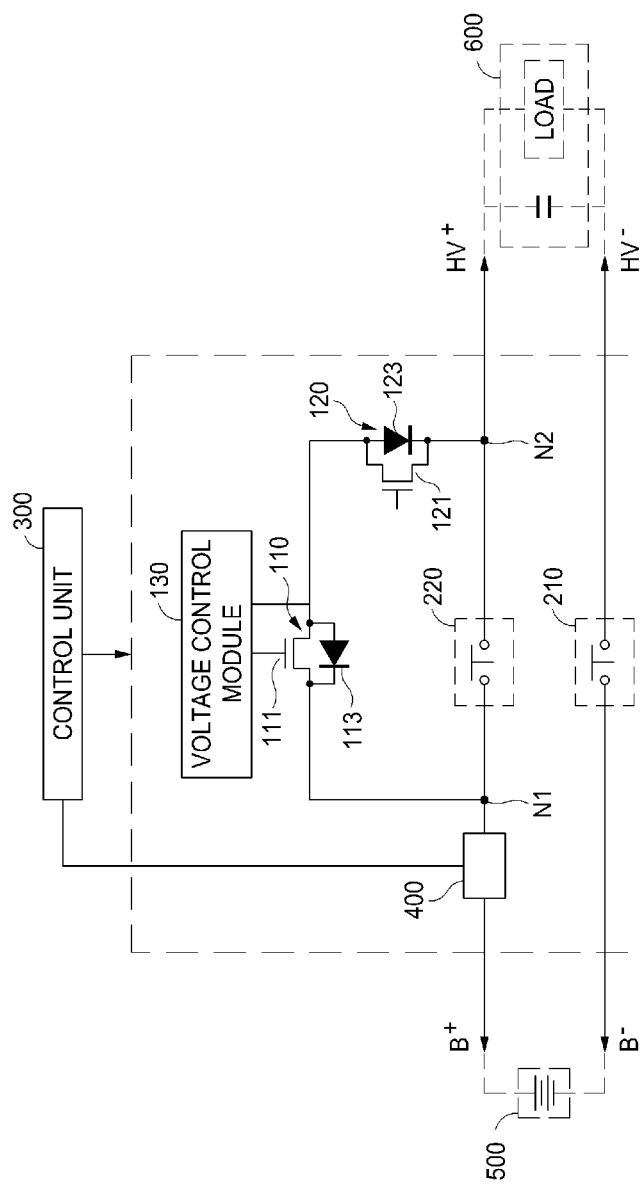
FIG. 2 is a view showing the configuration of a PRA for an electric vehicle according to a first preferred embodiment of the present invention.

FIG. 2 is a view showing a configuration of a power relay assembly (PRA) for an electric vehicle according to a first preferred embodiment of the present invention.

Referring to FIG. 2, a PRA for an electric vehicle according to the first preferred embodiment of the present invention (hereinafter abbreviated as "driving device") includes a first relay 210, a second relay 220, a first switching unit 110, a second switching unit 120, a voltage control module 130, a current sensor 400, and a control unit 300. Hereinafter, the operation of each component will be described.

The first relay 210 is connected between the −terminal of the battery 500 and the −terminal of the load side 600, and when power is supplied to the load side 600 and the battery 500 is charged according to the control signal of the control unit 300, the first relay 210 is first turned on to electrically connect the −terminal of the battery 500 and the load side 600-terminal, and when power supply is stopped and charging is stopped, the first relay 210 is turned off at the end, thereby electrically disconnecting the −terminal of the battery 500 and the −terminal of the load side 600.

The second relay 220 is connected between the +terminal of the battery 500 and the +terminal of the load side 600, and is turned on according to the control signal of the control unit 300, so that regular power is supplied to the load side 600, and the second relay 220 allows the charging current to be supplied from the charging device (not shown) connected to the load side 600 to the side of the battery 500.

The first switching unit 110 and the second switching unit 120 are connected in series with each other, and the first switching unit 110 and the second switching unit 120 connected in series with each other are connected in parallel to both ends of the second relay 220.

One end of the first switching unit 110 is connected to one end of the second relay 220 on the positive terminal side of the battery 500, and the other end of the first switching unit 110 is connected to one end of the second switching unit 120 to control the flow of current according to the voltage control signal inputted from the voltage control module 130.

The first switching unit 110 may include a switching element (hereinafter referred to as a "first switching element") 111 that is turned on/off according to a voltage control signal input from the voltage control module 130, and a diode 113 connected in parallel thereto.

The first switching element 111 may be implemented with a semiconductor switching element, for example, an Insulated Gate Bipolar Transistor (IGBT) or a Field Effect Transistor (MOS-FET). The diode 113 connected in parallel with the semiconductor switching element 111 is connected in parallel with the semiconductor switching element 111 such that when the semiconductor switching element 111 is turned on, the direction opposite to the current flowing in the semiconductor switching element 111 becomes the forward direction of the diode 113, and the diode 113 may be a separate diode combined with a semiconductor switching element 111, or may be implemented with a diode inside the semiconductor switching element 111 like a parasitic diode.

Moreover, one end of the second switching unit 120 is connected to the other end of the first switching unit 110, and the other end is connected to one end of the load side 600 of the second relay 220 to control the flow of current according to the control signal of the control unit 300.

The second switching unit 120 may include a switching element (hereinafter referred to as a "second switching element") 121 which is turned on/off according to the control signal of the control unit 300, and a diode 123 connected in parallel thereto. The second switching element 121 may be implemented as a semiconductor switching element, and the diode 123 connected in parallel with the semiconductor switching element is connected in parallel with the semiconductor switching element 121 such that the direction opposite to the current flowing when the semiconductor switching element 121 is turned on is to be forward.

In the first preferred embodiment of the present invention, the switching element 121 may be implemented as an IGBT or FET, and the diode 123 connected in parallel to the switching element 121 may be implemented as a separate diode or may be implemented as an internal diode of the semiconductor switching element like a parasitic diode.

Here, in the case where the diodes 113 and 123 included in the first switching unit 110 and the second switching unit 120 are implemented with internal diodes, when switching elements 111 and 121 are IGBTs, it may be implemented with an internal diode formed between the emitter and the collector, and when switching elements 111 and 121 are FETs, it may be implemented with an internal diode formed between the source and drain.

At this time, the diode 113 of the first switching unit 110 and the diode 123 of the second switching unit 120 are set to have opposite forward directions, and the diode 113 of the first switching unit 110 is installed such that the positive terminal side of the battery 500 from the second switching unit 120 is in the forward direction, and the diode 123 of the second switching unit 120 is installed such that the positive terminal side of the load side 600 from the first switching unit 110 is in the forward direction.

Furthermore, according to the control signal input from the control unit 300, the voltage control module 130 forms an equipotential across the second relay 220 by turning the first switching element 111 on/off, and limits the amount of current flowing through the first switching element 111.

Specifically, upon receiving the first switching element 111 turn-on control signal for pre-charge from the control unit 300, the voltage control module 130 outputs a voltage control signal to the first switching element 111 so that current flows within a range in which a current greater than a predetermined value does not flow according to the characteristics of the first switching element 111.

If the first switching element 111 suddenly turns on, a large current can be outputted at once from the high voltage battery 500 to the load side, and this large current may cause damage to the first switching element 111 as well as the second switching element 121 and the load side. Therefore, it is necessary to slowly charge the capacitor on the load side by limiting the amount of current. To this end, when the first switching element 111 is implemented as an IGBT, the gate-emitter voltage VGE is adjusted to operate the IGBT in the active region, and when the first switching element 111 is implemented as a FET, the gate-source voltage VGS is adjusted to operate the FET in the saturation region.

Figure 3A:
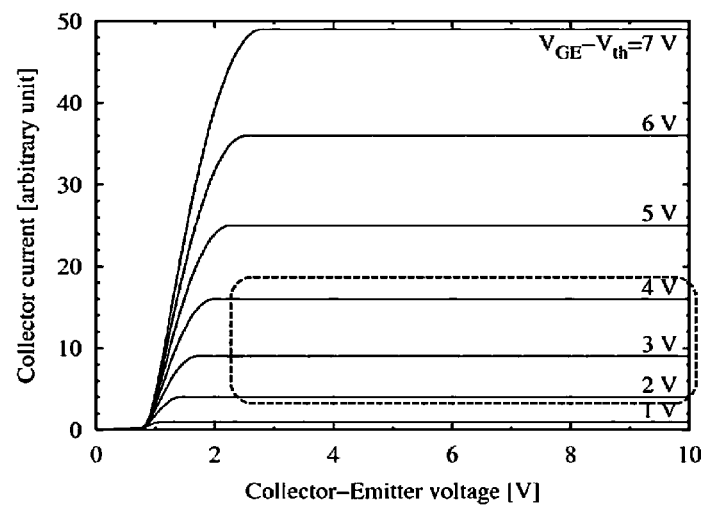
FIGS. 3A and 3B are graphs showing output current characteristics of typical IGBT and FET, respectively.
Figure 3B:
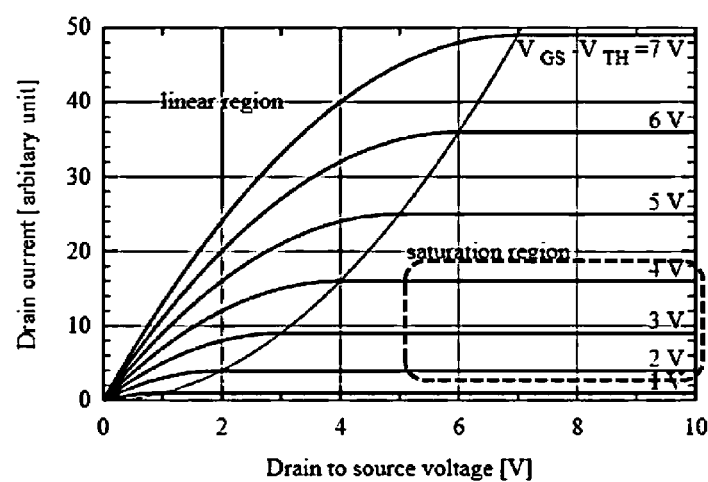

FIGS. 3A and 3B are graphs showing output current characteristics of typical IGBT and FET, respectively. This will be described with reference to FIGS. 3A and 3B.

First, as shown in FIG. 3A, in the case of an IGBT, when the gate-emitter voltage VGE exceeds the threshold voltage VTH, current flows, and at this time, as VCE increases while the collector-emitter voltage VCE is less than VGE-VTH, the current increases linearly but if the collector-emitter voltage VCE is greater than VGE-VTH, the current value remains constant even as VCE increases. The first preferred embodiment of the present invention defines this region as the active region, and when the first switching element 111 is an IGBT, the voltage control module 130 outputs the gate voltage and the emitter voltage so that the first switching element 111 operates in the active region. Particularly, the first preferred embodiment of the present invention controls the current flowing through the first switching element 111 to be maintained at 20 A or less, and if the graph of FIG. 3A is applied to the present invention, as indicated by the red dotted line, the voltage control module 130 outputs the gate voltage and the emitter voltage so that the VGE-VTH voltage value becomes 2V to 4V, and the collector-emitter voltage value becomes about 4V to 10V.

Similarly, as shown in FIG. 3B, in the case of a MOS-FET, when the gate-source voltage VGS exceeds the threshold voltage VTH, current flows and at this time, as the VDS increases while the drain-to-source voltage (VDS) is less than VGS-VTH, the current increases linearly, and when the drain-source voltage VDS is greater than VGS-VTH, the current value remains constant even when VDS increases. The first preferred embodiment of the present invention defines this region as a saturation region, and when the first switching element 111 is a MOS-FET, the voltage control module 130 outputs the gate voltage and the source voltage so that the first switching element 111 operates in the saturation region. Particularly, the first preferred embodiment of the present invention controls the current flowing through the first switching element 111 to be maintained at 20 A or less, and if the graph of FIG. 3B is applied to the present invention, as indicated by the red dotted line, the voltage control module 130 outputs the gate voltage and the source voltage so that the VGS-VTH voltage value becomes 2V to 4V and the drain-source voltage value is about 5V to 10V.

The current sensor 400 is installed on the positive terminal side of the battery 500 such that the current outputted from the battery 500 or the charging current inputted to the battery 500 is measured and the measured current value is outputted to the control unit 300.

The control unit 300 receives and examines the current value from the current sensor 400, and accordingly, outputs control signals for controlling on/off of the first relay 210, the second relay 220, the first switching element 111, and the second switching element 121 to each component. However, the control signal for controlling the first switching element 111 is outputted to the voltage control module as described above.

Meanwhile, in the PRA for an electric vehicle according to the first preferred embodiment of the present invention shown in FIG. 2, a connection point between each component is defined as a node and the first preferred embodiment of the present invention can also be briefly expressed as follows.

The first relay 210 is connected between the negative terminal of the battery 500 and the negative terminal of the load side 600, and the second relay 220 is connected between the first node N1 to which the positive terminal of the battery 500 is connected and the second node N2 to which the positive terminal of the load side 600 is connected. The first switching unit 110 is connected between the first node N1 and the second switching unit 120, and the second switching unit 120 is connected between the first switching unit 110 and the second node N2.

When the first switching element 111 is implemented as an IGBT (N-type FET), a collector (drain) is connected to the first node N1, and an emitter (source) is connected to the second switching element 121. Similarly, when the second switching element 121 is implemented as an IGBT (N-type FET), the collector (drain) is connected to the second node N2, and the emitter (source) is connected to the first switching element 111.

Hereinafter, with reference to FIGS. 4A to 5C, a function of each component of the power relay assembly for an electric vehicle and a method of driving the power relay assembly for an electric vehicle according to the first preferred embodiment of the present invention will be described.

FIGS. 4A to 4E are views illustrating an operation process in which power is supplied from a battery 500 to a load side 600 according to a first preferred embodiment of the present invention. Hereinafter, an operation process in which power is supplied and cut off from the battery 500 to the load side 600 according to a preferred embodiment of the present invention will be described with reference to FIGS. 4A to 4E.

First, in a state where all of the switching elements are open, when power is supplied from the battery 500 to the load side 600, the control unit 300 turns on the first relay 210. Then, the control unit 300 outputs a control signal to turn on the first switching element 111 to the voltage control module 130, and the voltage control module 130 outputs voltages to the gate and emitter (or source) of the first switching element 111, respectively, to turn on the first switching element. At this time, as described with reference to FIGS. 3A and 3B, the voltage outputted from the voltage control module 130 to the first switching element 111 is appropriately selected according to the first switching element 111 so that a current of less than 20 A flows through the first switching element 111.

Figure 4A:
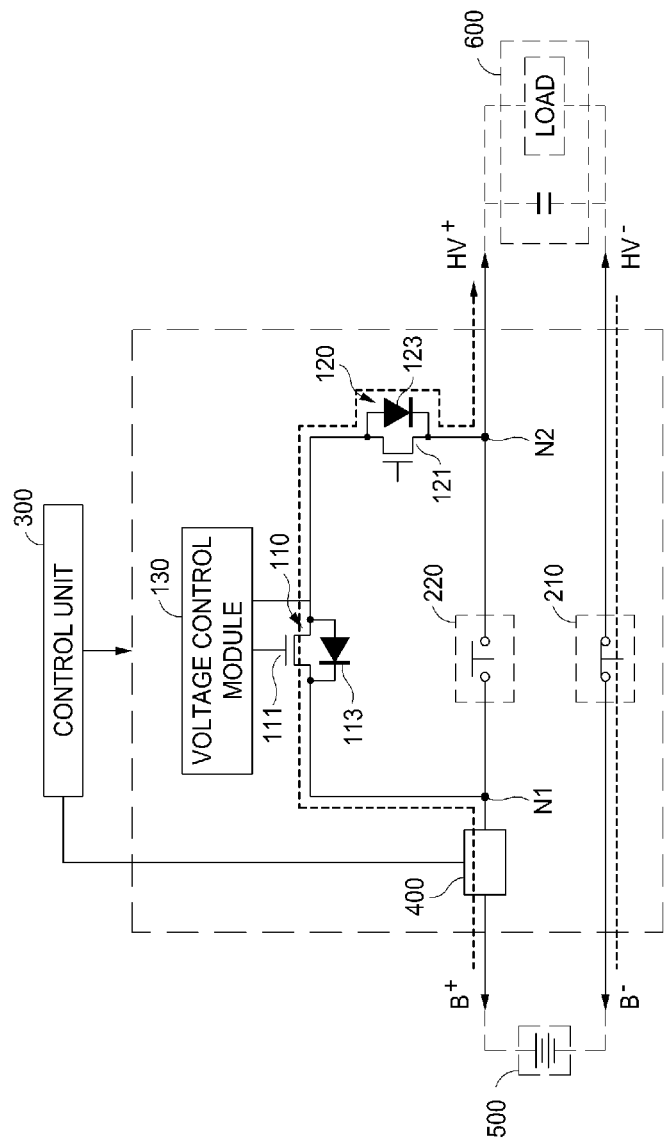
FIGS. 4A to 4E are views illustrating an operation process in which power is supplied from a battery to a load side according to a preferred embodiment of the present invention.

Then, the current outputted from the battery 500 flows to the load side 600 through the first switching element 111 and the diode 123 of the second switching unit 120, and the capacitor included in the load side 600 is pre-charged (see FIG. 4A).

Figure 4B:
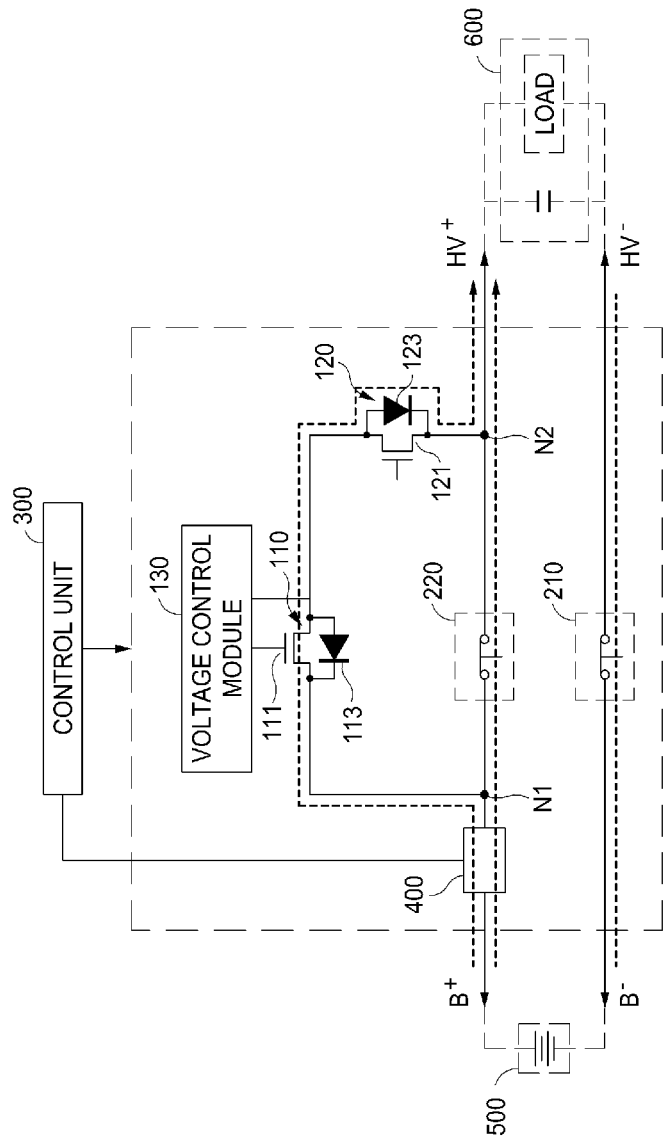

After the pre-charge is completed, the control unit 300 turns on the second relay 220, and a current greater than the current flowing through the first switching element 111 flows through the second relay 220 (See FIG. 4B). When pre-charge is completed, since an equipotential is formed between both ends of the second relay 220, even when the second relay 220 is turned on, sparks or arcs are not generated at the contact points of the second relay 220.

Figure 4C:
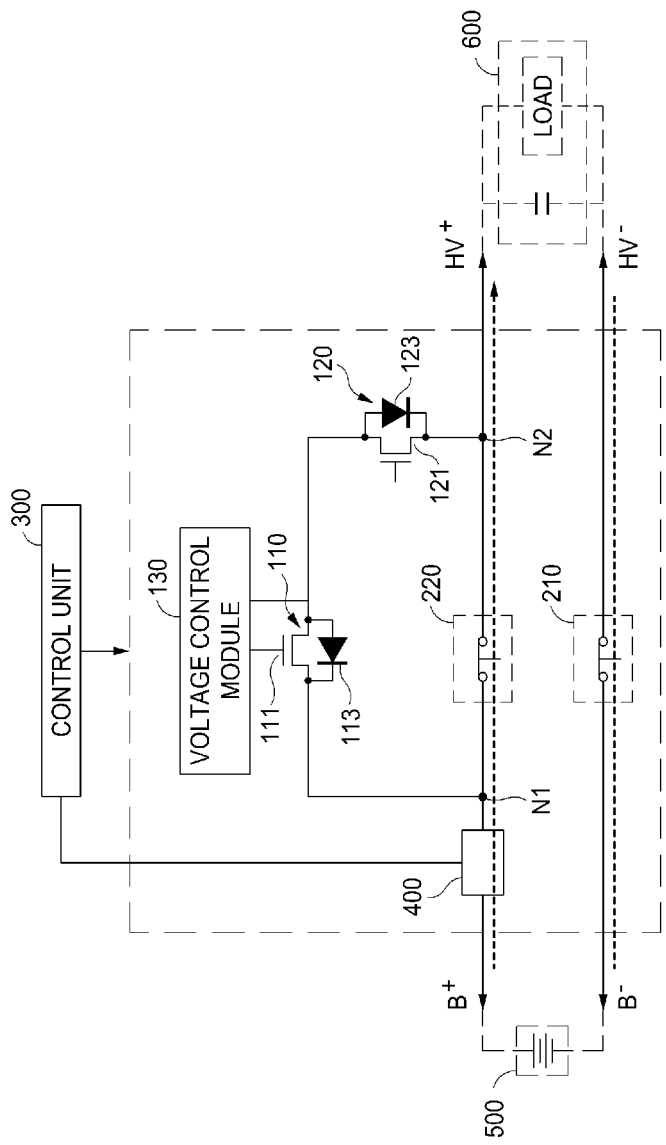

When the current flows through the second relay 220, the control unit 300 outputs a control signal to the voltage control module 130 to turn off the first switching element 111, and the voltage control module 130 turns off the first switching element 111 (see FIG. 4C). In this case, normal current supply is made from the battery 500 to the load side 600.

Figure 4D:
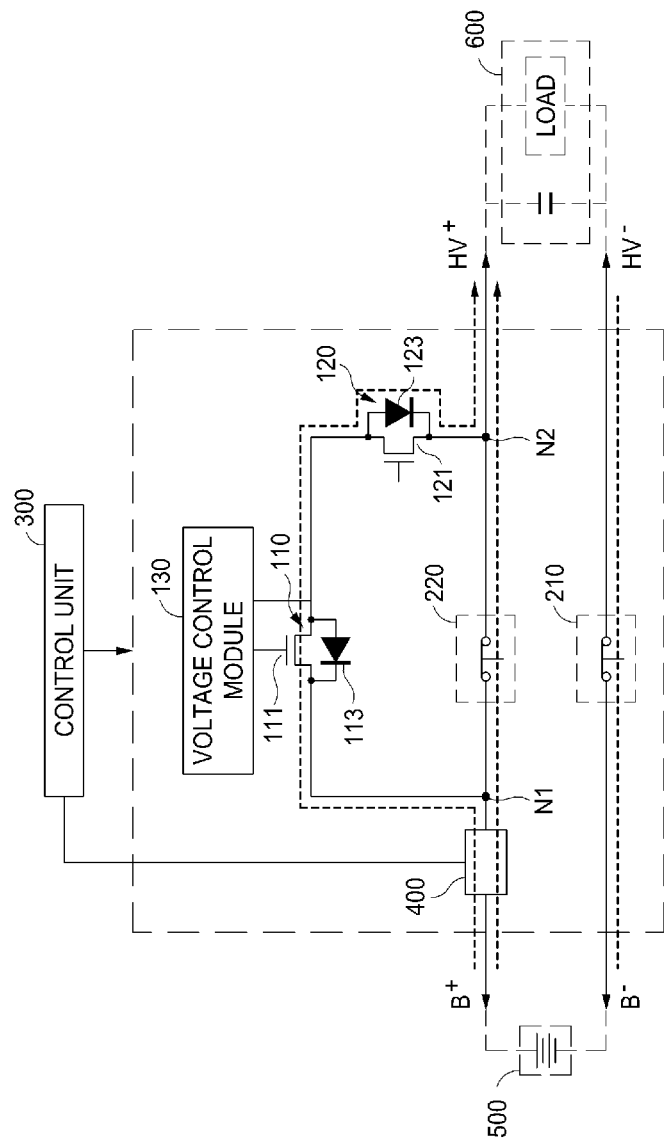

Thereafter, when the power supply is cut off from the battery 500 to the load side 600, the control unit 300 outputs a control signal to the voltage control module 130, and the voltage control module 130 outputs a control signal to the gate and emitter (or source) of the first switching element 111 as in FIG. 4A to turn on the first switching element 111, and part of the current supplied from the battery 500 to the load side 600 through the second relay 220 flows through the first switching element 111 and the diode 123 of the second switching unit 120 to the load side 600 (see FIG. 4D).

Figure 4E:
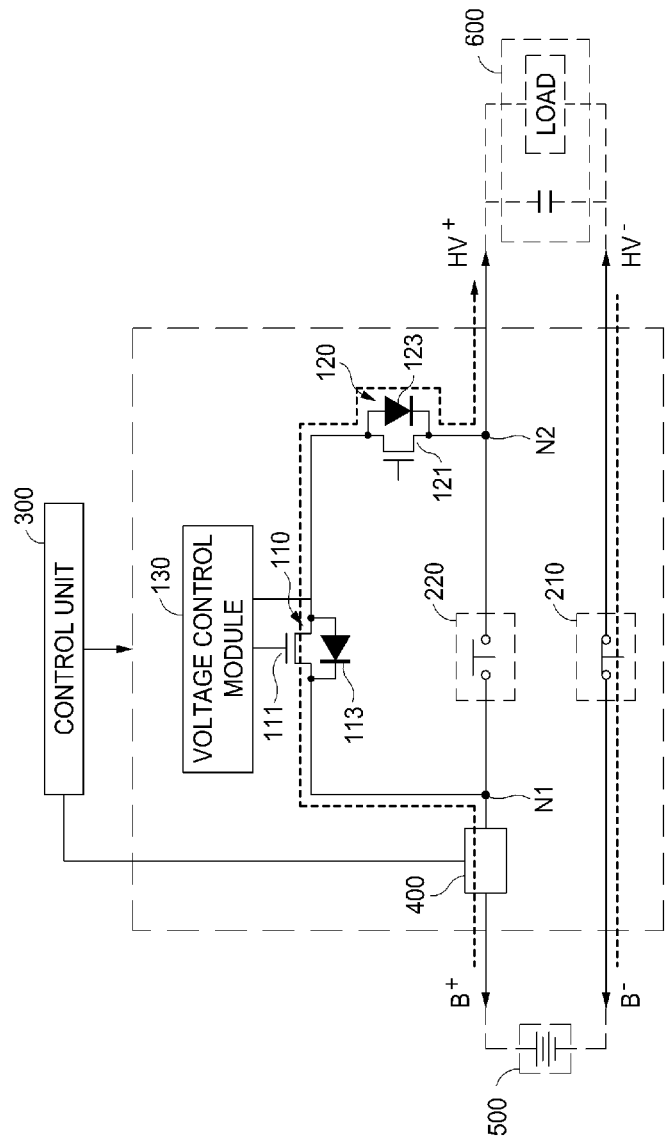

The control unit 300 turns off the second relay 220 in the next step, and the current flowing from the battery 500 to the load side 600 now flows only through the first switching element 111 (see FIG. 4E). In a state where the current flows through the second relay 220 and the first switching element 111 together, since both ends of the second relay 220 form an equipotential, even when the second relay 220 is turned off, sparks or arcs are not generated at the contacts of the second relay 220.

FIGS. 5A to 5C are views illustrating an operation process in which charging current is supplied to the battery 500 according to a preferred embodiment of the present invention. First, in a state where all of the switching elements are open, when starting to supply the charging current to the side of the battery 500, the control unit 300 turns on the first relay 210 and turns on the second switching element 121. Then, the charging current flows toward the battery 500 through the second switching element 121 and the diode 113 of the first switching unit 110 (see current ①), and after that, when the second relay 220 is turned on, a portion of the charging current flowing through the second switching element 121 flows toward the battery 500 through the second relay 220 (see current ②), and as the control unit 300 turns off the second switching element 121, the charging current flows only through the second relay 220 so that a regular charging process is performed (see FIG. 5A).

In the process of completing the charging by cutting off the charging current, the control unit 300 turns on the second switching element 121, and then, a portion of the charging current supplied to the battery 500 through the second relay 220 flows to the battery 500 through the second switching element 121 and the diode 113 of the first switching unit 110 (see FIG. 5B).

Thereafter, the control unit 300 turns off the second relay 220, and the current flowing to the battery 500 now flows only through the second switching element 121 (see FIG. 5C). In a state where the current flows through the second relay 220 and the second switching element 121 together, since both ends of the second relay 220 form an equipotential, even when the second relay 220 is turned off, sparks or arcs are not generated at the contacts of the second relay 220.

Finally, when the control unit 300 turns off the second switching element 121, the charging current flowing to the battery 500 is completely cut off, and the charging process of the battery 500 ends.

Figure 6B:
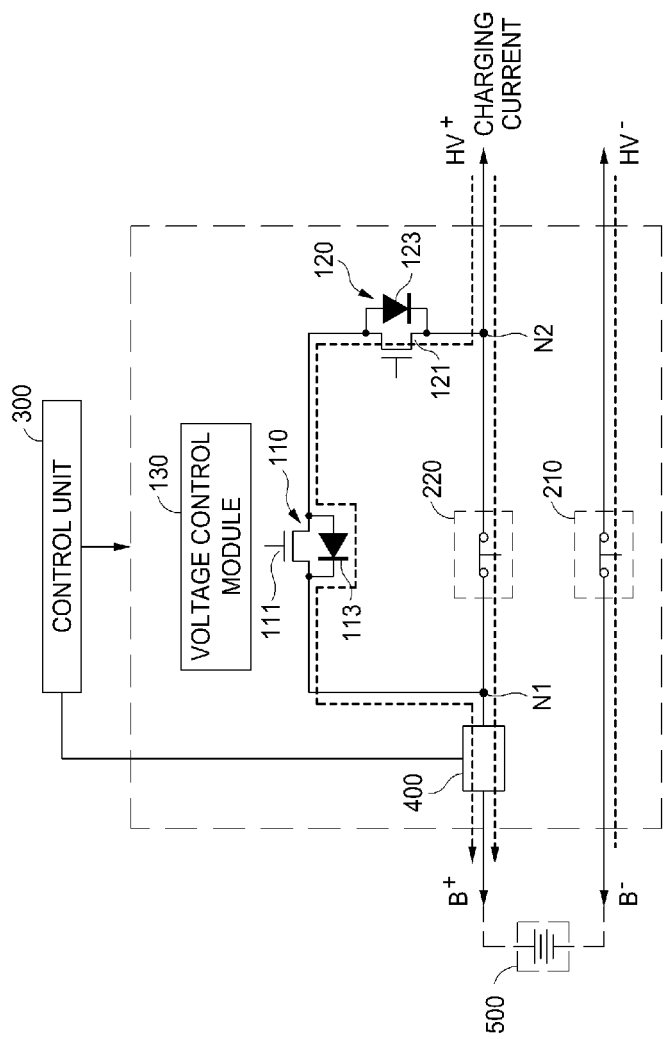
FIG. 6 is a view showing the configuration of a PRA for an electric vehicle according to a modified embodiment of the first preferred embodiment of the present invention.
Figure 6:
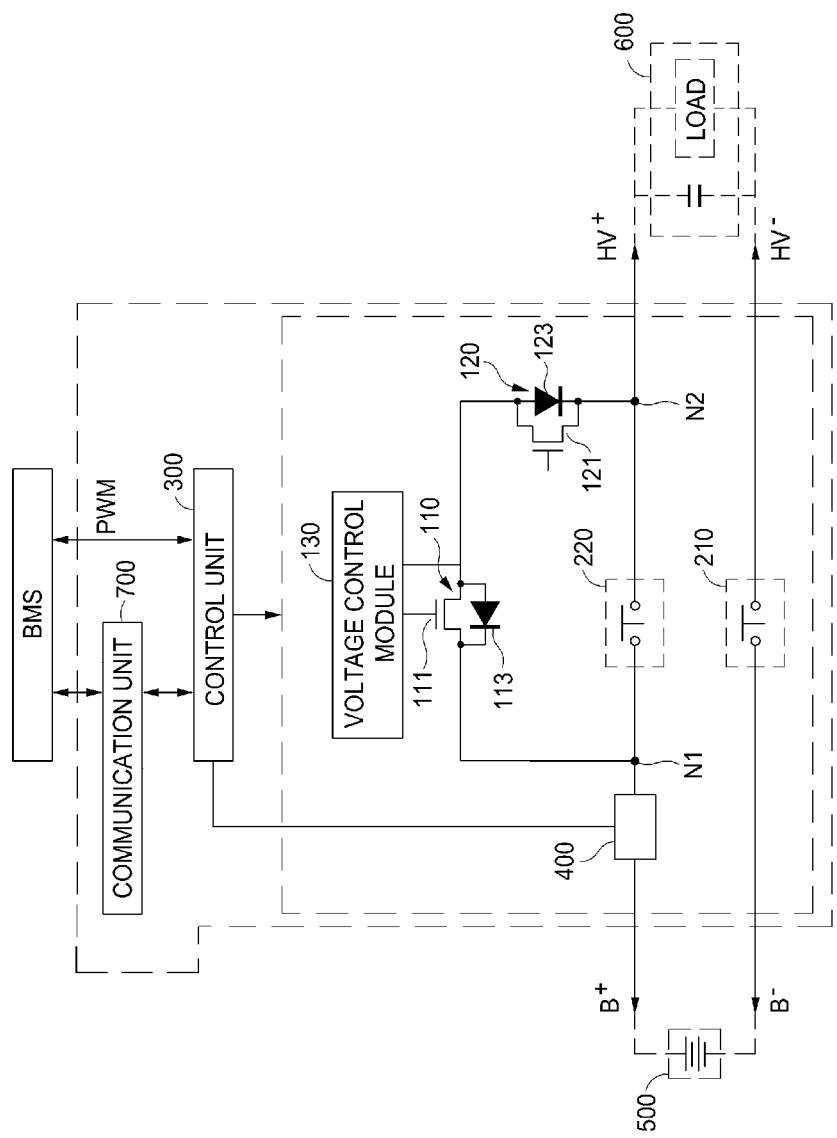

FIG. 6 is a view showing the configuration of a PRA for an electric vehicle according to a modified embodiment of the first preferred embodiment of the present invention.

The control unit 300 of the PRA for an electric vehicle according to the first embodiment shown in FIGS. 2 to 5C is not limited to a method of communicating with a main controller (not shown) or a battery management system (BMS) 700 of the vehicle, but the control unit 300 of the PRA for an electric vehicle according to the modified embodiment shown in FIG. 6 adopts a method of performing communication with a main controller (not shown) or a Battery Management System (BMS) of a vehicle. For this, the power relay assembly (PRA) further includes a communication unit 700 to perform CAN communication or LIN communication with the vehicle's main controller or BMS through the communication unit 700.

Referring to FIG. 6, the communication unit 700 of the modified embodiment of the present invention performs communication with the BMS in a CAN communication method, and the control unit 300 of the PRA receives a control command indicating an operation start (PRA ON), maintenance, and operation stop (PRA OFF) of the PRA from the BMS through the communication unit 700, and operates the PRA as described with reference to FIGS. 2 to 5C according to the received control command.

In addition, in the process of performing the on/hold/ off operation of the PRA, whenever the detailed operations described with reference to FIGS. 2 to 5C is performed, the control unit 300 transmits status information indicating each state to the BMS through the communication unit 700, or after the on/hold/off operation of the PRA is completed, transmits status information indicating this to the BMS as status information through the communication unit 700. The BMS receives status information, checks whether the PRA is abnormal, and controls the PRA based on this.

In addition, the control unit 300 is connected directly to the vehicle's main controller (not shown) or BMS with a wire, so that when a communication error occurs between the vehicle's main controller or the BMS and the communication unit 700, the control unit 300 provides a fail-safety function by mutually transmitting and receiving control commands and status information using a PWM signal.

At this time, the control command transmitted from the vehicle's main controller or BMS to the control unit 300 can be identified by adjusting the duty ratio of the PWM signal. For example, the PRA ON command can be transmitted as a PWM signal having a duty ratio of 80% to the control unit 300, and the PRA OFF command can be transmitted as a PWM signal having a duty ratio of 30% to the control unit 300, and the control unit 300 may identify the PRA on/off/hold command, etc. by checking the duty ratio of the received PWM signal. Similarly, the control unit 300 may transmit different status information as a PWM signal by adjusting the duty ratio of the PWM signal.

So far, a power relay assembly for an electric vehicle and a driving method thereof according to a first embodiment of the present invention have been described. Hereinafter, a power relay assembly for an electric vehicle and a driving method thereof according to a second embodiment of the present invention will be described with reference to FIGS. 7 to 10.

Figure 7:
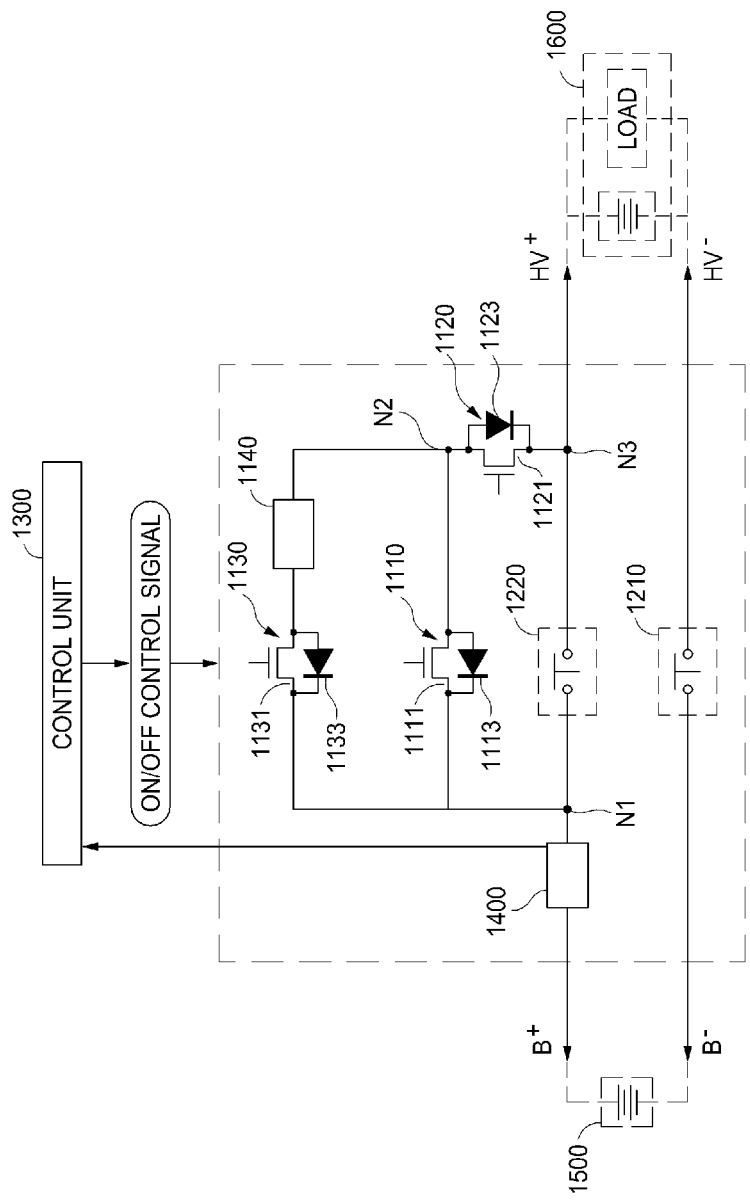
FIG. 7 is a view showing the configuration of a PRA for an electric vehicle according to a second preferred embodiment of the present invention.

FIG. 7 is a view showing the configuration of a PRA for an electric vehicle according to a second preferred embodiment of the present invention.

Referring to FIG. 7, a PRA for an electric vehicle according to a second preferred embodiment of the present invention (hereinafter abbreviated as "driving device") includes a first relay 1210, a second relay 1220, a first switching unit 1110, a second switching unit 1120, a pre-charge switching unit 1130, a current sensor 1400, a protective resistance 1140, and a control unit 1300. Hereinafter, the operation of each component will be described.

The first relay 1210 is connected between the –terminal of the battery 1500 and the –terminal of the load side 1600, and when power is supplied to the load side 1600 and the battery 1500 is charged according to the control signal of the control unit 1300, the first relay 1210 is first turned on to electrically connect the-terminal of the battery 1500 and the –terminal of the load side 1600, and when power supply is stopped and charging is stopped, the first relay 1210 is turned off at the end, thereby electrically disconnecting the –terminal of the battery 1500 and the –terminal of the load side 1600.

The second relay 1220 is connected between the +terminal of the battery 1500 and the +terminal of the load side 1600, and is turned on according to the control signal of the control unit 1300, so that regular power is supplied to the load side 1600, and the second relay 1220 allows the charging current to be supplied from the charging device (not shown) connected to the load side 1600 to the side of the battery 1500.

The first switching unit 1110 and the second switching unit 1120 are connected in series with each other, and the first switching unit 1110 and the second switching unit 1120 connected in series with each other are connected in parallel to both ends of the second relay 1220.

One end of the first switching unit 1110 is connected to one end of the second relay 1220 on the positive terminal side of the battery 1500, and the other end of the first switching unit 1110 is connected to one end of the second switching unit 1120 to control the flow of current according to the control signal from the control unit 1300.

One end of the second switching unit 1120 is connected to the other end of the first switching unit 1110, and the other end is connected to one end of the load side 1600 of the second relay 1220 to control the flow of current according to the control signal from the control unit 1300.

The first switching unit 1110 and the second switching unit 1120 are implemented with switching elements 1111 and 1121 that are turned on/off according to the control signal from the control unit 1300, respectively, and diodes 1113 and 1123 connected in parallel thereto. The switching elements 1111 and 1121 may be implemented with semiconductor switching elements, and the diodes 1113 and 1123 connected in parallel with the semiconductor switching elements are connected in parallel with the semiconductor switching elements 1111 and 1121 such that when the semiconductor switching elements 1111 and 1121 are turned on, the direction opposite to the current flowing direction becomes the forward direction.

Specifically, in a second preferred embodiment of the present invention, the switching elements 1111 and 1121 may be implemented with Insulated Gate Bipolar Transistor (IGBT) or Field Effect Transistor (FET), and the diodes 1113 and 1123 connected in parallel to the switching elements 1111 and 1121 may be implemented with separate diodes or may be implemented with internal diodes of the semiconductor switching element like a parasitic diode.

In the case where the diodes 1113 and 1123 included in the first switching unit 1110 and the second switching unit 1120 are implemented with internal diodes, when switching elements 1111 and 1121 are IGBTs, it may be implemented with an internal diode formed between the emitter and the collector, and when switching elements 1111 and 1121 are FETs, it may be implemented with an internal diode formed between the source and drain.

At this time, the diode 1113 of the first switching unit 1110 and the diode 1123 of the second switching unit 1120 are set to have opposite forward directions, and the diode 1113 of the first switching unit 1110 is installed such that the positive terminal side of the battery 1500 from the second switching unit 1120 is in the forward direction, and the diode 1123 of the second switching unit 1120 is installed such that the positive terminal side of the load side 1600 from the first switching unit 1110 is in the forward direction.

The pre-charge switching unit 1130 has one end connected to one end of the second relay 1220 in the positive terminal side of the battery 1500 and the other end connected to the protective resistance 1140. That is, one end of the pre-charge switching unit 1130 is connected to the first node N1, and the second relay 1220, the first switching unit 1110, and the pre-charge switching unit 1130 are connected to the first node N1. Furthermore, like the first switching unit 1110 and the second switching unit 1120, the pre-charge switching unit 1130 includes a semiconductor switching element (hereinafter, referred to as "pre-charge switching element" 1131) that is turned on/off according to the control signal of the control unit 1300 and a diode 1133 connected in parallel with this, and the pre-charge switching element 1131 is implemented with an IGBT or FET. The diode 1133 may also be implemented with a separate diode or may be implemented with a diode inside the pre-charge switching element 1131. In addition, the forward direction of the diode 1133 of the pre-charge switching unit 1130 is set opposite to the forward direction of the diode 1123 of the second switching unit 1120.

The protective resistance 1140 is connected between the pre-charge switching unit 1130 and the connection node N2 of the first switching unit 1110 and the second switching unit 1120 so that the rapid current is prevented from flowing through the pre-charge switching unit 1130.

The current sensor 1400 is installed on the positive terminal side of the battery 1500 such that the current outputted from the battery 1500 or the charging current inputted to the battery 1500 is measured and the current value is outputted to the control unit 1300.

The control unit 1300 receives and examines the current value from the current sensor 1400, and accordingly, outputs to respective components the control signals for controlling on/off of the first relay 1210, the second relay 1220, the switching element (hereinafter referred to as "first switching element") 1111 of the first switching unit 1110, the switching element (hereinafter referred to as "second switching element") 1121 of the second switching unit 1120, and the pre-charge switching element 1131.

Meanwhile, in the PRA for an electric vehicle according to the second preferred embodiment of the present invention shown in FIG. 7, a connection point between each component is defined as a node and the second preferred embodiment of the present invention can also be briefly expressed as follows.

The first relay 1210 is connected between the negative terminal of the battery 1500 and the negative terminal of the load side 1600, and the second relay 1220 is connected between the first node N1 to which the positive terminal of the battery 1500 is connected and the third node N3 to which the positive terminal of the load side 1600 is connected. The first switching unit 1110 is connected between the first node N1 and the second node N2, and the second switching unit 1120 is connected between the second node N2 and the third node N3. The pre-charge switching unit 1130 and the protective resistance 1140 are connected in series with each other between the first node N1 and the second node N2.

In addition, when the pre-charge switching element 1131 and the first switching element 1111 are implemented with an IGBT (N-type FET), the collector (drain) of the switching elements 1131 and 1111 is connected to the first node N1, and the emitter (source) is connected to the second node N2. Similarly, when the second switching element 1121 is implemented with an IGBT (N-type FET), the collector (drain) is connected to the third node N3, and the emitter (source) is connected to the second node N2.

Hereinafter, with reference to FIGS. 8A to 9C, a function of each component of the power relay assembly for an electric vehicle and a method of driving the power relay assembly for an electric vehicle according to the second preferred embodiment of the present invention will be described.

FIGS. 8A to 8E are views illustrating an operation process in which power is supplied from a battery 1500 to a load side 1600 according to a second preferred embodiment of the present invention. Hereinafter, an operation process in which power is supplied and cut off from the battery 1500 to the load side 1600 according to a second preferred embodiment of the present invention will be described with reference to FIGS. 8A to 8E.

First, in a state where all of the switching elements are open, when power is supplied from the battery 1500 to the load side 1600, the control unit 1300 turns on the first relay 1210. Then, the pre-charge switching element 1131 is turned on. Then, the current outputted from the battery 1500 flows to the load side 1600 through the pre-charge switching element 1131, the protective resistance 1140, and the diode 1123 of the second switching unit 1120, and pre-charges the capacitor included in the load side 1600 (see FIG. 8A).

Figure 8A:
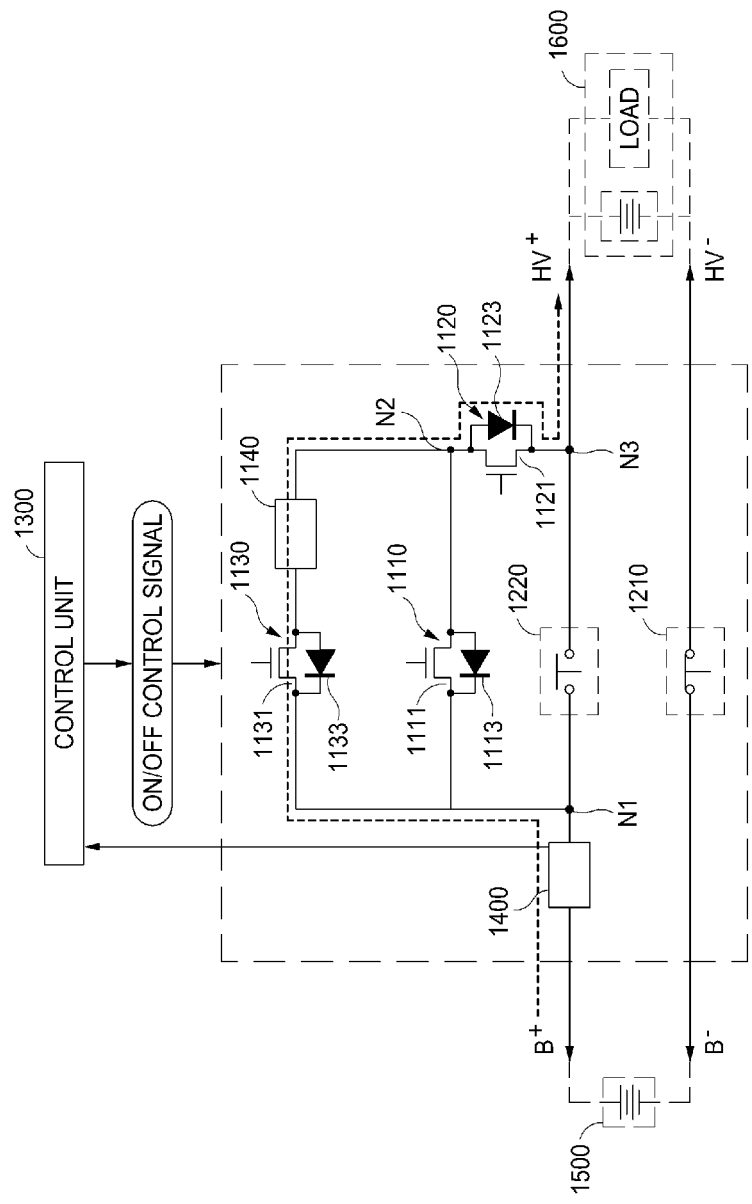
Figure 8B:
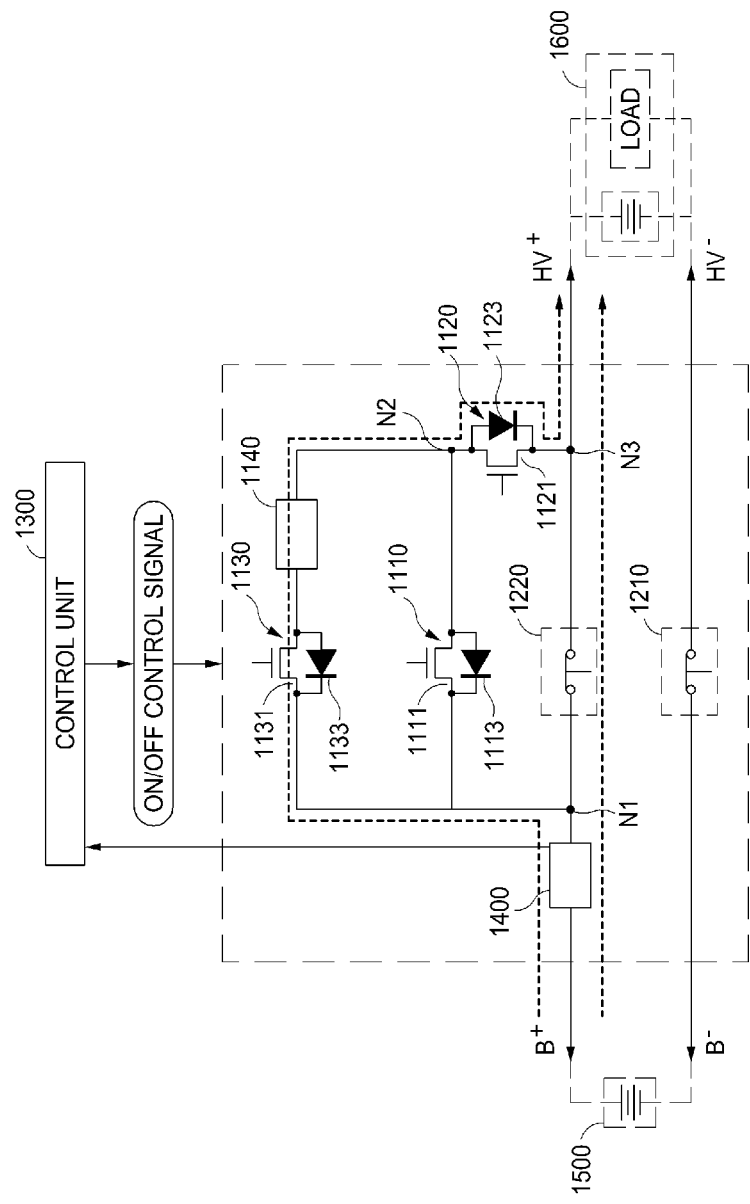

After pre-charge is completed, the control unit 1300 turns on the second relay 1220 (ON), and most of the current flowing through the pre-charge switching element 1131 flows through the second relay 1220 (see FIG. 8B). When the pre-charge is completed, since an equipotential is formed between both ends of the second relay 1220, even when the second relay 1220 is turned on, sparks or arcs are not generated at the contact points of the second relay 1220.

Figure 8C:
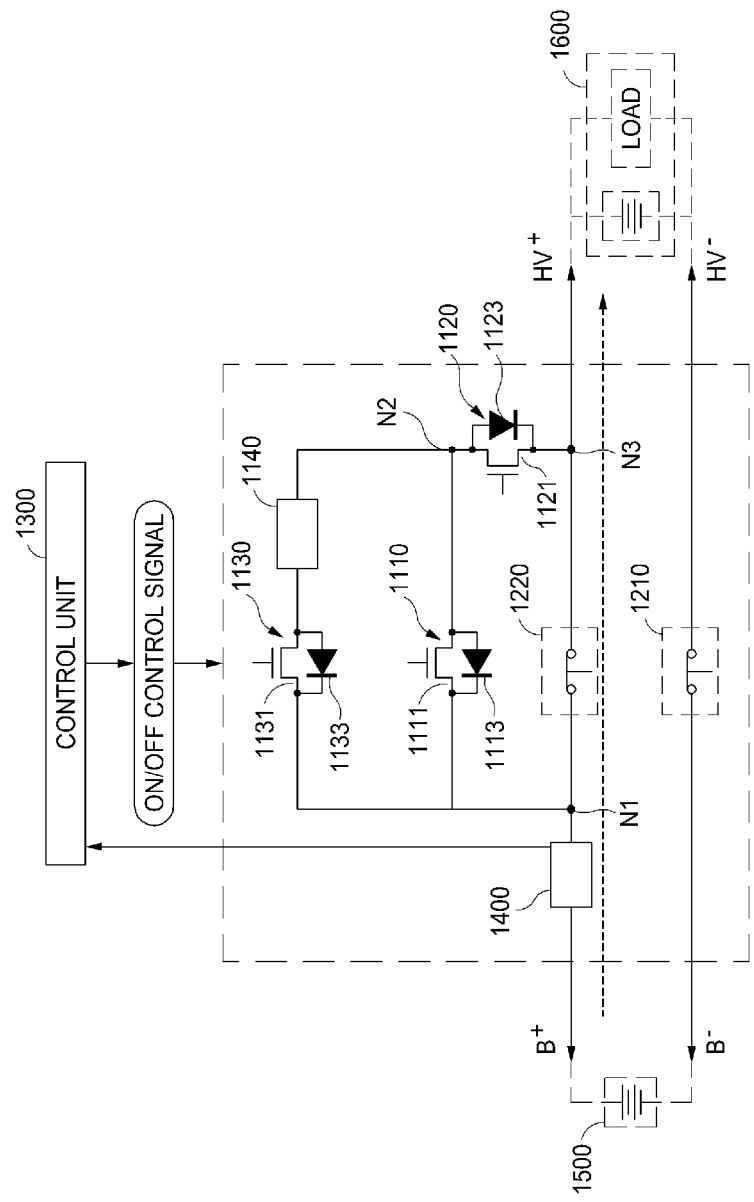

When the current flows through the second relay 1220, the control unit 1300 turns off the pre-charge switching element 1131 (see FIG. 8C). In this case, normal current supply is made from the battery 1500 to the load side 1600.

Figure 8D:
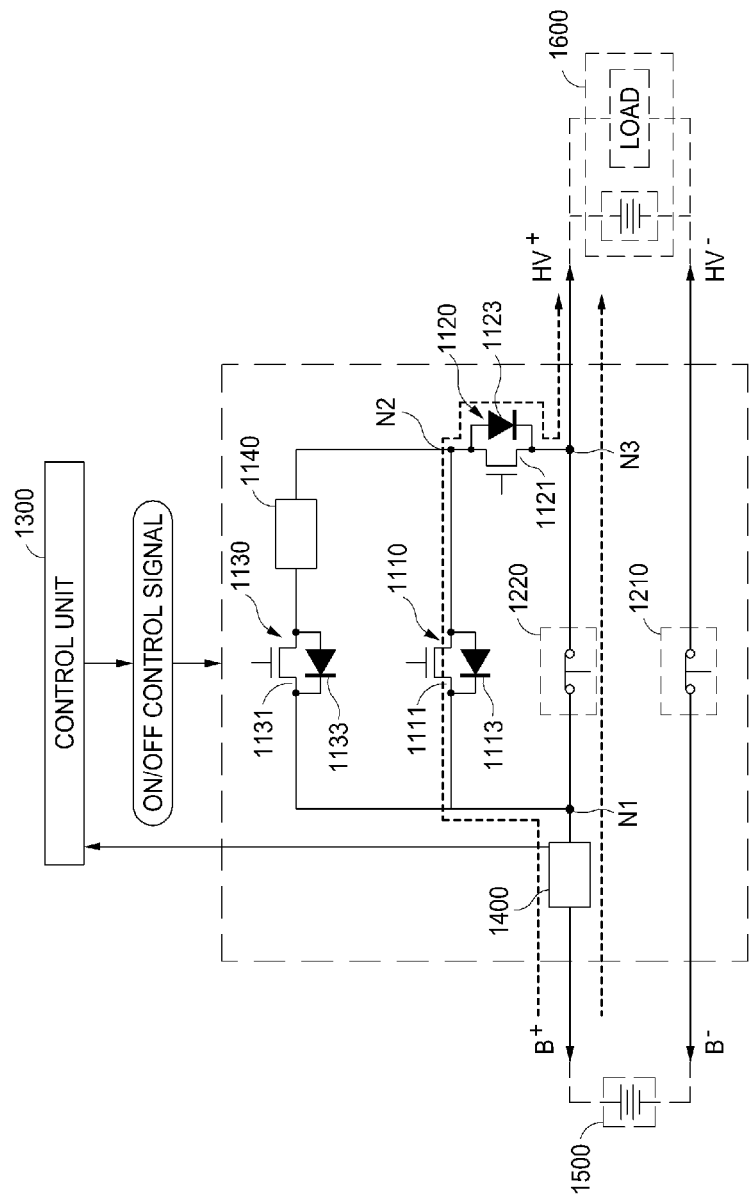
Figure 8C:
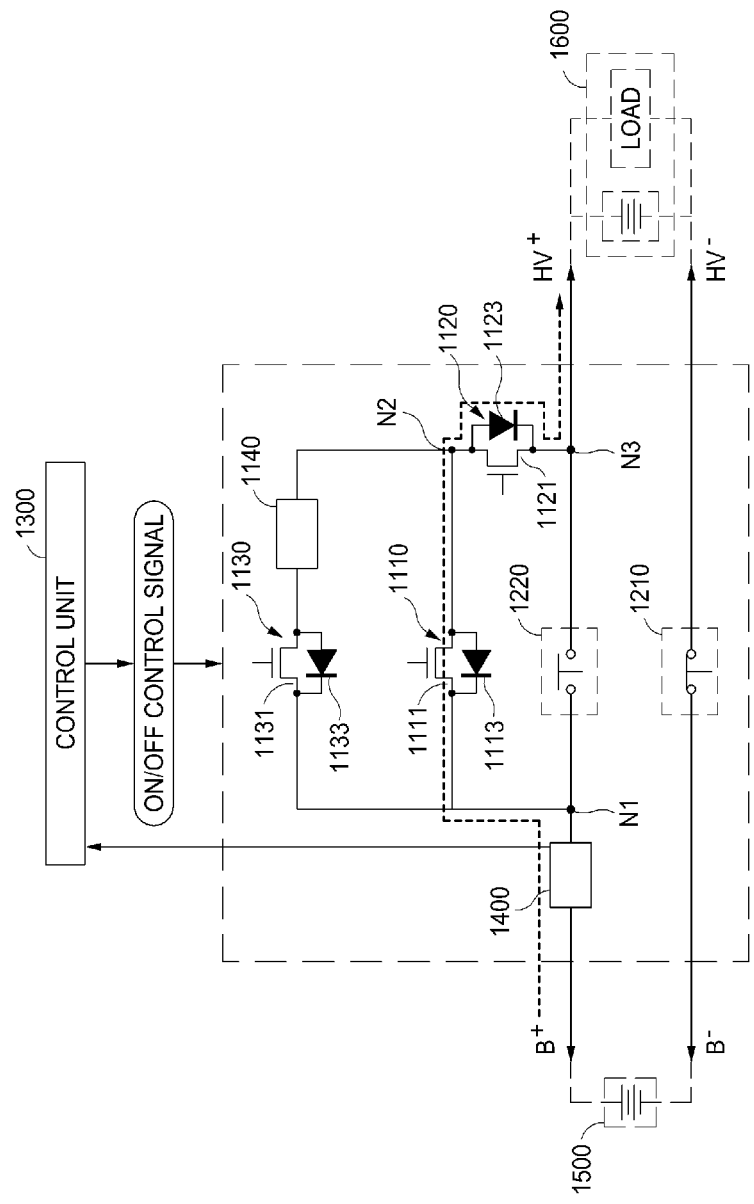

Then, when the power supply is cut off from the battery 1500 to the load side 1600, the control unit 1300 turns on the first switching element 1111, a portion of the current supplied from the battery 1500 to the load side 1600 through the second relay 1220 flows to the load side 1600 through the first switching element 1111 and the diode 1123 of the second switching unit 1120 (see FIG. 8D).

The control unit 1300 turns off the second relay 1220 in the next step, and the current flowing from the battery 1500 to the load side 1600 now flows only through the first switching element 1111 (see FIG. 8E). In a state where the current flows through the second relay 1220 and the first switching element 1111 together, since both ends of the second relay 1220 form an equipotential, even when the second relay 1220 is turned off, sparks or arcs are not generated at the contacts of the second relay 1220.

Figure 9A:
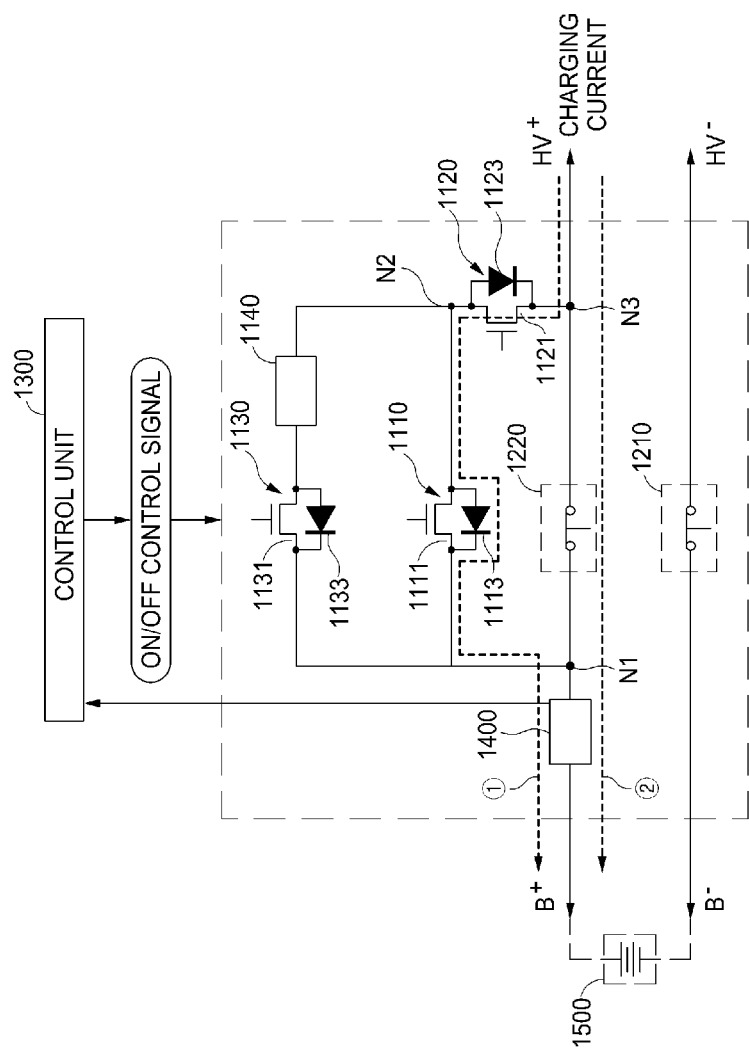
FIGS. 9A to 9C are views illustrating an operation process in which charging current is supplied to a battery according to a second preferred embodiment of the present invention.
Figure 9B:
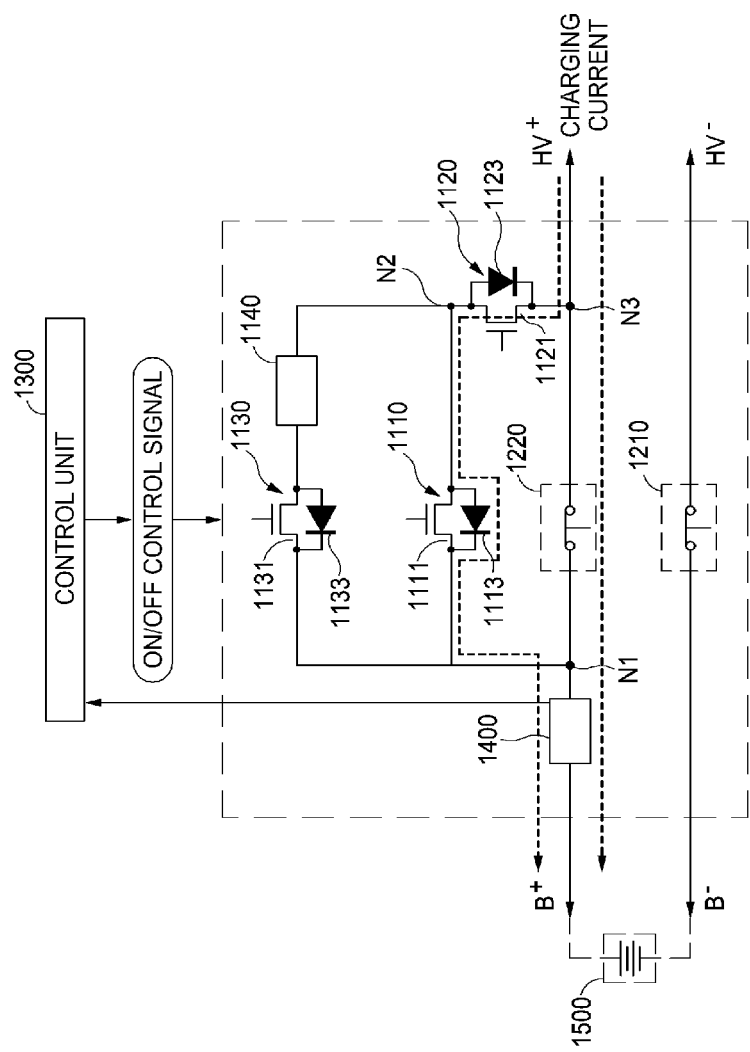
Figure 9C:
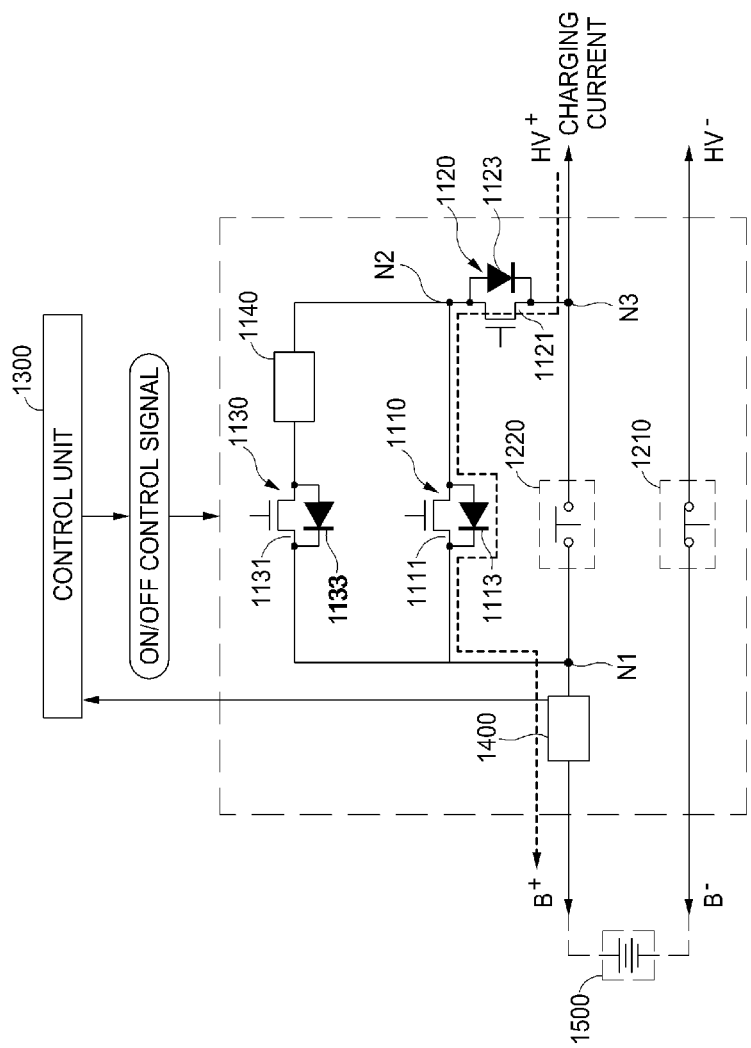

FIGS. 9A to 9C are views illustrating an operation process in which charging current is supplied to the battery 1500 according to a second preferred embodiment of the present invention. FIGS. 9A to 9C are views illustrating an operation process in which charging current is supplied to the battery 1500 according to a second preferred embodiment of the present invention.

First, in a state where all of the switching elements are open, when starting to supply the charging current to the side of the battery 1500, the control unit 1300 turns on the first relay 1210 and turns on the second switching element 1121. Then, the charging current flows toward the battery 1500 through the second switching element 1121 and the diode 1113 of the first switching unit 1110 (see current ①), and after that, when the second relay 1220 is turned on, a portion of the charging current flowing through the second switching element 1121 flows toward the battery 1500 through the second relay 1220 (see current ②), and as the control unit 1300 turns off the second switching element 1121, the charging current flows only through the second relay 1220 so that a regular charging process is performed (see FIG. 9A).

In the process of completing the charging by cutting off the charging current, the control unit 1300 turns on the second switching element 1121, and then, a portion of the charging current supplied to the battery 1500 through the second relay 1220 flows to the battery 1500 through the second switching element 1121 and the diode 1113 of the first switching unit 1110 (see FIG. 9B).

Thereafter, the control unit 1300 turns off the second relay 1220, and the current flowing to the battery 1500 now flows only through the second switching element 1121 (see FIG. 9C). In a state where the current flows through the second relay 1220 and the second switching element 1121 together, since both ends of the second relay 1220 form an equipotential, even when the second relay 1220 is turned off, sparks or arcs are not generated at the contacts of the second relay 1220.

Finally, when the control unit 1300 turns off the second switching element 1121, the charging current flowing to the battery 1500 is completely cut off, and the charging process of the battery 1500 ends.

Figure 10:
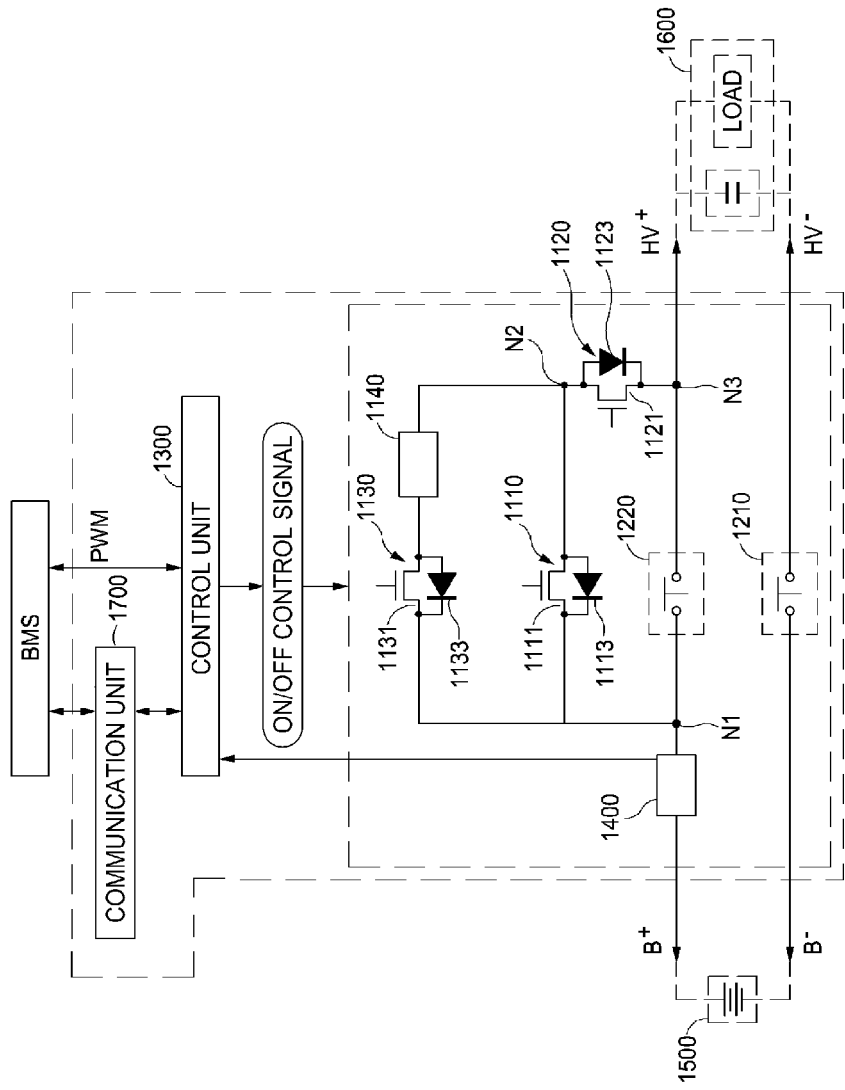
FIG. 10 is a view showing the configuration of a PRA for an electric vehicle according to a modified embodiment of the second preferred embodiment of the present invention.

FIG. 10 is a view showing the configuration of a PRA for an electric vehicle according to a modified embodiment of the second preferred embodiment of the present invention.

The control unit 1300 of the PRA for an electric vehicle according to the second embodiment shown in FIGS. 7 to 9C is not limited to a method of communicating with a main controller (not shown) or a battery management system (BMS) 1700 of the vehicle, but the control unit 1300 of the PRA for an electric vehicle according to the modified embodiment shown in FIG. 10 adopts a CAN communication method or a LIN communication method as a method of communicating with the vehicle's main controller (not shown) or BMS. For this, the power relay assembly (PRA) according to the modified embodiment of the second embodiment further includes a communication unit 1700 to perform CAN communication or LIN communication with the vehicle's main controller or BMS through the communication unit 1700.

The control unit 1300 receives an ON/hold/OFF command of the PRA from the main control unit (not shown) or the BMS of the vehicle through the communication unit 1700, and as described above with reference to FIGS. 7 to 9C, the control unit 1300 operates the PRA, and transmits status information of each stage to the main control unit (not shown) or BMS of the vehicle.

In addition, the control unit 1300 and the BMS (or the main control unit of the vehicle) are directly connected through a wire, and if a communication error occurs between the communication unit 1700 and the BMS (or the main control unit of the vehicle), the control unit 1300 and the BMS (or main control unit of the vehicle) exchange control commands and status information with each other by transmitting and receiving a PWM signal through a wire.

The function performed between the control unit 1300 and the BMS (or the vehicle main control unit) through the communication unit 1700 illustrated in FIG. 10 is the same as that described with reference to FIG. 6, so that a detailed description thereof will be omitted.

So far, the present invention has been focused on the preferred embodiments. Those skilled in the art to which the present invention pertains will appreciate that the present invention may be implemented in a modified form without departing from the essential characteristics of the present invention. Therefore, the disclosed embodiments should be considered in descriptive sense only not in limited perspective sense. The scope of the invention is defined not by the detailed description of the invention but by the appended claims, and all differences within the scope will be construed as being included in the present invention.

The invention claimed is:

1. A power relay assembly for an electric vehicle comprising:
    a first relay connected between a negative terminal of a battery and a negative terminal of a load side;
    a second relay connected between a positive terminal of the battery and a positive terminal of the load side;
    a first switching unit having one end connected to one end of the second relay on the positive terminal side of the battery and the other end connected to a second switching unit;
    the second switching unit having one end connected to the first switching unit and the other end connected to the load side one end of the second relay;
    a voltage control module configured to control the voltage output to the first switching unit according to a control signal inputted from a control unit to limit an amount of current flowing through the first switching unit to a predetermined level; and
    the control unit configured to control the first relay, the second relay, the first switching unit, and the second switching unit by outputting control signals.

2. The power relay assembly of claim 1, wherein each of the first switching unit and the second switching unit comprises:
    a switching element configured to be turned on/off according to a control signal inputted from the control unit; and
    a diode connected in parallel with the switching element.

3. The power relay assembly of claim 2, wherein diodes included in each of the first switching unit and the second switching unit have opposite directions in a forward direction.

4. The power relay assembly of claim 3, wherein the diode of the first switching unit is set so that the direction towards the positive terminal of the battery is forward, and the diode of the second switching unit is set so that the direction towards the positive terminal of the load side is forward.

5. The power relay assembly of claim 3, wherein the switching element included in the first switching unit and the second switching unit is implemented as an Insulated Gate Bipolar Transistor (IGBT) or Field Effect Transistor (FET),
    wherein the diode included in the first switching unit and the second switching unit is implemented as an internal diode included in an IGBT or FET.

6. The power relay assembly of claim 2, wherein, when supplying power from the battery to the load side, the control unit
    turns on the first relay,
    turns on the switching element of the first switching unit through the voltage control module to perform precharge by allowing a current outputted from the battery to flow to the load side through the switching element of the first switching unit and the diode of the second switching unit, and
    when equipotential between both ends of the second relay is formed, turns on the second relay and turns off the first switching unit through the voltage control module.

7. The power relay assembly of claim 6, wherein when the power supply from the battery to the load side is cut off, the control unit turns on the switching element of the first switching unit through the voltage control module to allow the current outputted from the battery to flow to the load side through the second relay, the switching element of the first switching unit, and the diode of the second switching unit, and then turns off the second relay, and then turns off the switching element of the first switching unit through the voltage control module to cut off power supply.

8. The power relay assembly of claim 2, wherein, when charging current is supplied to the battery, the control unit turns on the switching element of the second switching unit to allow the charging current to flow to the battery through the switching element of the second switching unit and the diode of the first switching unit, and then forms equipotential between both ends of the second relay, and then turns on the second relay to allow the charging current to flow through the second relay, and then performs regular charging by turning off the switching element of the second switching unit.

9. The power relay assembly of claim 8, wherein, when cutting off charging current supply, the control unit turns on a switching element of the second switching unit to allow a charging current to flow to the battery through a switching element of the second switching unit and a diode of the first switching unit, and then turns off the second relay to cut off the charging current flowing through the second relay, and then cuts off the supply of charging current by turning off the switching element of the second switching unit.

10. The power relay assembly of claim 2, further comprising a current sensor installed between a positive terminal of the battery and one end of the second relay, and configured to measure at least one of a current outputted from the battery and a current flowing into the battery and output a current value to the control unit,
wherein the control unit outputs a control signal according to the current value inputted from the current sensor.

11. The power relay assembly of claim 1, further comprising a communication unit configured to perform communication with a main controller of a vehicle or a Battery Management System (BMS), receive a control command instructing to start (ON) or stop (OFF) the power relay assembly from the main controller or the BMS to output the received control command to the control unit, and transmit status information of the power relay assembly inputted from the control unit to the main controller or the BMS.

12. A method of driving a power relay assembly for an electric vehicle including a first relay connected between a negative terminal of a battery and a negative terminal of a load side, a second relay connected between a first node to which a positive terminal of the battery is connected and a second node to which a positive terminal of the load side is connected, a first switching unit connected between the first node and a second switching unit, and a second switching unit connected between the first switching unit and the second node, wherein the first switching unit and the second switching unit include a switching element and a diode connected in parallel with the switching element, respectively, the method comprising:
when supplying power from the battery to the load side,
(a) turning on the first relay;
(b) turning on the switching element of the first switching unit through a voltage control module to allow the current outputted from the battery to flow to the load side through the switching element of the first switching unit and the diode of the second switching unit to perform pre-charge; and
(c) when equipotential between both ends of the second relay is formed, turning on the second relay and turning off the first switching unit through the voltage control module,
wherein, during operation (b), the voltage control module controls voltage output to the switching element of the first switching unit according to a control signal inputted from a control unit to limit an amount of current flowing through the first switching unit to a predetermined level.

13. The method of claim 12, further comprising:
when power supply to the load side is cut off from the battery,
turning on the switching element of the first switching unit through the voltage control module to allow the current outputted from the battery to flow to the load side through the second relay and a switching element of the first switching unit and a diode of the second switching unit;
turning off the second relay; and
turning off the switching element of the first switching unit through the voltage control module to cut off the power supply.

14. The method of claim 12, further comprising:
when charging current is supplied to the battery,
turning on the switching element of the second switching unit to allow the charging current to flow to the battery through the switching element of the second switching unit and the diode of the first switching unit to form equipotential between both ends of the second relay;
turning on the second relay to allow a charging current to flow through the second relay; and
performing regular charging by turning off the switching element of the second switching unit.

15. The method of claim 14, further comprising:
when cutting off the charging current supply,
turning on a switching element of the second switching unit to allow a charging current to flow to the battery through a switching element of the second switching unit and a diode of the first switching unit;
turning off the second relay to cut off the charging current flowing through the second relay; and
cutting off charging current supply by turning off the switching element of the second switching unit.

16. A power relay assembly for an electric vehicle comprising:
a first relay connected between a negative terminal of a battery and a negative terminal of a load size;
a second relay connected between a positive terminal of the battery and a positive terminal of the load side;
a first switching unit having one end connected to one end of the second relay on the positive terminal side of the battery and another end connected to a second switching unit;
the second switching unit having one end connected the first switching unit and the other end connected to the load side one end of the second relay;
a pre-charges switching unit having one end connected to one end of the second relay on the positive terminal side of the battery and the other end connected to a protective resistance;
the protective resistance connected between the pre-charge switching unit and a connection node of the first switching unit and the second switching unit; and
a control unit configured to output a control signal to control on/off of the first relay, the second relay, the first switching unit, the second switching unit, and the pre-charge switching unit, wherein each of the first switching unit and the second switching unit comprises:
a switching element configured to be turned on/off according to a control signal inputted from the control unit; and
a diode connected in parallel with the switching element, and
wherein when power supply from the battery to the load side is cut off, the control unit:
turns on the switching element included in first switching unit to allow the current outputted from the battery to flow to the load side through the second relay, the switching element of the first switching unit, and the diode of the second switching unit;
then turns off the second relay; and
then turns off the switching element included in the first switching unit to cut off power supply.

17. The power relay assembly of claim 16, wherein diodes included in each of the first switching unit and the second switching unit have opposite directions in a forward direction.

18. The power relay assembly of claim 17, wherein the diode of the first switching unit is set so that the direction towards the positive terminal of the battery is forward, and the diode of the second switching unit is set so that the direction towards the positive terminal of the load side is forward.

19. The power relay assembly of claim 17, wherein the switching element included in the first switching unit and the second switching unit is implemented as an Insulated Gate Bipolar Transistor (IGBT) or Field Effect Transistor (FET), wherein the diode included in the first switching unit and the second switching unit is implemented as an internal diode included in an IGBT or FET.

20. The power relay assembly of claim 16, wherein, when supplying power from the battery to the load side, the control unit
turns on the first relay,
turns on the pre-charge switching unit to perform pre-charge by allowing a current outputted from the battery to flow to the load side through the pre-charge switching unit and the diode of the second switching unit, and
when equipotential between both ends of the second relay is formed, turns on the second relay and turns off the pre-charge switching unit.

21. The power relay assembly of claim 16, wherein, when charging current is supplied to the battery, the control unit turns on the switching element of the second switching unit to allow the charging current to flow to the battery through the switching element of the second switching unit and the diode of the first switching unit, and then forms equipotential between both ends of the second relay, and then turns on the second relay to allow the charging current to flow through the second relay, and then performs regular charging by turning off the switching element of the second switching unit.

22. The power relay assembly of claim 21, wherein, when cutting off charging current supply, the control unit turns on a switching element of the second switching unit to allow a charging current to flow to the battery through a switching element of the second switching unit and a diode of the first switching unit, and then turns off the second relay to cut off the charging current flowing through the second relay, and then cuts off the supply of charging current by turning off the switching element of the second switching unit.

23. The power relay assembly of claim 16, further comprising a current sensor installed between a positive terminal of the battery and one end of the second relay, and configured to measure at least one of a current outputted from the battery and a current flowing into the battery and output a current value to the control unit, wherein the control unit outputs a control signal according to the current value inputted from the current sensor.

24. The power relay assembly of claim 16, further comprising a communication unit configured to perform communication with a main controller of a vehicle or a Battery Management System (BMS), receive a control command instructing to start (ON) or stop (OFF) the power relay assembly from the main controller or the BMS to output the received control command to the control unit, and transmit status information of the power relay assembly inputted from the control unit to the main controller or the BMS.

25. A method of driving a power relay assembly for an electric vehicle including a first relay connected between a negative terminal of a battery and a negative terminal of a load side, a second relay connected between a first node to which a positive terminal of the battery is connected and a third node to which a positive terminal of the load side is connected, a first switching unit connected between the first node and a second node, a second switching unit connected between the second node and the third node, and a pre-charge switching unit and a protective resistance connected in series between the first node and the second node, wherein each of the first switching unit and the second switching unit includes a switching element and a diode connected in parallel with the switching element, the method comprising:
when supplying power from the battery to the load side, turning on the first relay;
turning on the pre-charge switching unit to allow current outputted from the battery to flow to the load side through the pre-charge switching unit and the diode of the second switching unit to perform pre-charge;
when equipotential between both ends of the second relay is formed, turning on the second relay and turning off the pre-charge switching unit; and
when power supply from the battery to the load side is cut off:
turning on the switching element included in the first switching unit to allow the current outputted from the battery to flow to the load side through the second relay and a switching element of the first switching unit and a diode of the second switching unit;
turning off the second relay; and
turning off the switching element included in the first switching unit to cut off the power supply.

26. The method of claim 25, further comprising:
when charging current is supplied to the battery, turning on the switching element of the second switching unit to allow the charging element to flow to the battery through the switching element of the second switching unit and the diode of the first switching unit to form equipotential between both ends of the second relay;
turning on the second relay to allow a charging current to flow through the second relay; and
performing regular charging by turning off the switching element of the second switching unit.

27. The method of claim 26, further comprising:
when cutting off the charging current supply, turning on a switching element of the second switching unit to allow a charging current to flow to the battery through a switching element of the second switching unit and a diode of the first switching unit;
turning off the second relay to cut off the charging current flowing through the second relay; and
cutting off charging current supply by turning off the switching element of the second switching unit.

* * * * *